(12) United States Patent
Ichikawa et al.

(10) Patent No.: US 9,263,694 B2
(45) Date of Patent: Feb. 16, 2016

(54) ORGANIC EL ELEMENT, DISPLAY DEVICE, AND ILLUMINATING DEVICE

(71) Applicant: Sony Corporation, Tokyo (JP)

(72) Inventors: Tatsuya Ichikawa, Kanagawa (JP); Taizo Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/598,314

(22) Filed: Jan. 16, 2015

(65) Prior Publication Data
US 2015/0214498 A1    Jul. 30, 2015

(30) Foreign Application Priority Data

Jan. 24, 2014    (JP) .................................. 2014-011300

(51) Int. Cl.
| | |
|---|---|
| *H01L 51/00* | (2006.01) |
| *H01L 51/50* | (2006.01) |
| *H01L 51/52* | (2006.01) |
| *H01L 27/32* | (2006.01) |

(52) U.S. Cl.
CPC .......... *H01L 51/504* (2013.01); *H01L 27/3209* (2013.01); *H01L 51/5203* (2013.01)

(58) Field of Classification Search
CPC .............. H01L 51/504; H01L 51/5088; H01L 51/5203; H01L 27/3209; H01L 33/387
USPC ................................................. 257/40, 59, 72
See application file for complete search history.

(56) References Cited

U.S. PATENT DOCUMENTS 8,519,381 B2*    8/2013    Oyamada ............... B82Y 10/00
257/40

FOREIGN PATENT DOCUMENTS

| JP | 2003-272860 A | 9/2003 |
|---|---|---|
| JP | 2012-194256 A | 10/2012 |

* cited by examiner

*Primary Examiner* — Tu-Tu Ho
(74) *Attorney, Agent, or Firm* — Michael Best & Friedrich LLP

(57) ABSTRACT

There is provided an organic EL element including a light emitting unit including at least a plurality of light emitting layers each containing an organic compound and emitting light when a predetermined potential difference is supplied and an intermediate layer that is arranged between the light emitting layers to inject electric charge into the light emitting layers, an anode and a cathode between which the light emitting unit is interposed in a stacking direction and which supply the predetermined potential difference to the light emitting unit, and a potential control mechanism configured to control potential of the intermediate layer in a manner that the potential is set to potential between potential of the anode and potential of the cathode.

12 Claims, 23 Drawing Sheets

ORGANIC EL ELEMENT, DISPLAY DEVICE, AND ILLUMINATING DEVICE

CROSS REFERENCE TO RELATED APPLICATIONS

This application claims the benefit of Japanese Priority Patent Application JP 2014-011300 filed Jan. 24, 2014, the entire contents of which are incorporated herein by reference.

BACKGROUND

The present disclosure relates to an organic EL element, a display device, and an illuminating device.

In recent years, as a light emitting element driven at a lower voltage, an organic electro-luminescence (EL) element that has a light emitting layer that contains an organic compound (which will also be referred to hereinafter as an organic light emitting layer) has been noticed. In addition, various technologies relating to a display device and an illuminating device that use such organic EL elements (which will also be referred to hereinafter respectively as an organic EL display device and an organic EL illuminating device) have been developed.

In such an element, a wavelength band of light emitted from an organic light emitting layer composed of a single material is limited to a given range, and thus it is difficult to cause the organic light emitting layer composed of a single material to emit white light. Thus, an organic EL element in which a plurality of organic light emitting layers that emit light having different wavelength bands are arranged in an in-plane direction or in a stacking direction and the organic light emitting layers are caused to emit light at the same time to generate white light has been proposed. For example, JP 2003-272860A discloses a technology for realizing higher light emission efficiency of an organic EL element in which a plurality of organic light emitting layers are arranged in a stacking direction (which will also be referred to hereinafter as a stacking-type organic EL element or a tandem-type organic EL element) by adjusting a specific resistance value of an intermediate layer such as a charge generation layer inserted between the organic light emitting layers.

On the other hand, it is not easy in a stacking-type organic EL element to maintain a uniform light emission ratio of each organic light emitting layer over a wide range of light emission luminance levels. Thus, chromaticity of light emitted from a stacking-type organic EL element changes, for example, as light emission luminance changes, and thus it is difficult to stably emit uniform white light. There is a concern of occurrence of such a change in chromaticity, which leads to deterioration in image quality of a display device in which such stacking-type organic EL elements are mounted. Thus, for example, JP 2012-194256A discloses a technology with respect to a display device that has pixels constituted by sub pixels which emit light of colors including red, green, blue, and white for suppressing a change in chromaticity of light emitted from the pixels over a wide range of light emission luminance levels by adjusting luminance of each sub pixel.

SUMMARY

In the technology disclosed in JP 2012-194256A, however, since it is necessary to drive each sub pixel to compensate for a change in chromaticity, a configuration of the element and signal processing become complicated, which consequently leads to a rise in power consumption and manufacturing costs. In addition, it is not possible to apply the technology disclosed in JP 2012-194256A without change to a device, for example, a monochromic display device or the like in which sub pixels are not initially included.

In consideration of the above-described circumstances, suppressing a change in chromaticity of an organic EL element with a simpler configuration has been demanded. Therefore, the present disclosure proposes a novel and improved organic EL element, display device, and illuminating device that enable a change in chromaticity to be suppressed with a simpler configuration.

According to an embodiment of the present disclosure, there is provided an organic EL element which includes: a light emitting unit which includes at least a plurality of light emitting layers each containing an organic compound and emitting light when a predetermined potential difference is supplied and an intermediate layer which is arranged between the light emitting layers to inject electric charge into the light emitting layers; an anode and a cathode between which the light emitting unit is interposed in a stacking direction and which supply the predetermined potential difference to the light emitting unit; and a potential control mechanism that controls potential of the intermediate layer in a manner that the potential is set to potential between potential of the anode and potential of the cathode.

According to an embodiment of the present disclosure, there is provided a display device in which an organic EL element is used as a light emitting element of a pixel included in a display screen, the organic EL element including: a light emitting unit which includes at least a plurality of light emitting layers which emit light when a predetermined potential difference is supplied and an intermediate layer which is arranged between the light emitting layers to inject electric charge into the light emitting layers; an anode and a cathode between which the light emitting unit is interposed in a stacking direction and which supply the predetermined potential difference to the light emitting unit; and a potential control mechanism that controls potential of the intermediate layer of the light emitting unit in a manner that the potential is set to potential between potential of the anode and potential of the cathode.

According to an embodiment of the present disclosure, there is provided an illuminating device in which an organic EL element is used as a light source, the organic EL element including: a light emitting unit which includes at least a plurality of light emitting layers which emit light when a predetermined potential difference is supplied and an intermediate layer which is arranged between the light emitting layers to inject electric charge into the light emitting layers; an anode and a cathode between which the light emitting unit is interposed in a stacking direction and which supply the predetermined potential difference to the light emitting unit; and a potential control mechanism that controls potential of the intermediate layer of the light emitting unit in a manner that the potential is set to potential between potential of the anode and potential of the cathode.

According to one or more embodiments of the present disclosure, a potential control mechanism that controls potential of an intermediate layer in a manner that the potential is set to potential between that of an anode and that of a cathode is provided in an organic EL element in which a plurality of light emitting layers each containing an organic compound are stacked with the intermediate layer therebetween. By controlling the potential of the intermediate layer with the potential control mechanism, potential of the plurality of light emitting layers can be controlled, and thus a change in chromaticity of light emission of the whole organic EL element can be suppressed with a simpler configuration without performing complicated signal processing or the like.

According to one or more embodiments of the present disclosure described above, it is possible to suppress a change in chromaticity with a simpler configuration. Note that the effect described above is not necessarily limiting, and along with or instead of the effect, any effect that is desired to be introduced in the present specification or other effects that can be expected from the present specification may be exhibited.

DETAILED DESCRIPTION OF THE EMBODIMENT(S)

Figure 1:
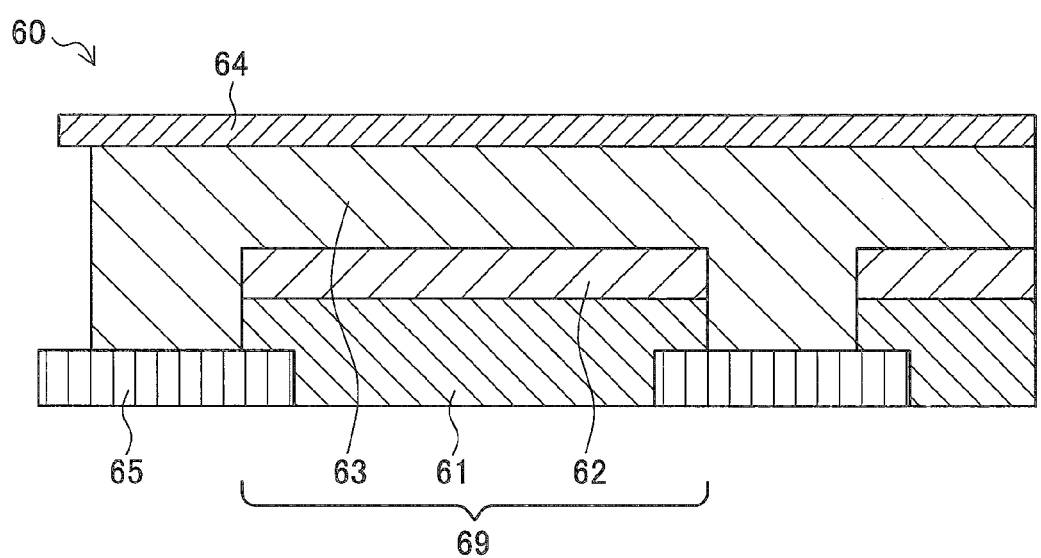
FIG. 1 is a cross-sectional diagram showing a schematic configuration of a stacking structure of a general organic EL element.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be provided in the following order.
1. Examination of a general organic EL element
2. First embodiment
2-1. Structure of an organic EL element
2-2. Comparison to general organic EL elements
2-3. Manufacturing method of an organic EL element
3. Second embodiment
3-1. Examination of a general organic EL element
3-2. Structure of an organic EL element
3-3. Manufacturing method of the organic EL element
4. Modified examples
5. Application examples
5-1. Application to an organic EL display device
5-2. Application to electronic apparatuses having display devices
6. Conclusion and supplement 1. Examination of a General Organic EL Element Prior to describing preferred embodiments of the present disclosure, in order to additionally clarify the present disclosure, results that the present inventors have obtained through an examination of a general organic EL element will be first described.

A schematic configuration of a general organic EL element will be described with reference to FIG. 1. FIG. 1 is a cross-sectional diagram showing a schematic configuration of a stacking structure of the general organic EL element.

Referring to FIG. 1, the general organic EL element 60 is a stacking-type organic EL element configured by stacking a yellow light emitting layer 61 (Y light emitting layer 61) that is an organic light emitting layer that emits light having a wavelength band corresponding to yellow, a charge generation layer (CGL) 62, and a blue light emitting layer 63 (B light emitting layer 63) that is an organic light emitting layer that emits light having a wavelength band corresponding to blue in this order. To be specific, a positive pole (anode) formed of a conductive material (not illustrated) is formed in the lower layer of the Y light emitting layer 61. In addition, a negative pole 64 (cathode 64) formed of a conductive material is formed in the upper layer of the B light emitting layer 63. When a predetermined potential difference is supplied between the anode and the cathode 64, a predetermined potential difference is supplied to each of the Y light emitting layer 61 and the B light emitting layer 63 which are interleaved between the anode and the cathode 64 and connected in series, and thereby the respective Y light emitting layer 61 and B light emitting layer 63 emit light having predetermined wavelength bands with predetermined luminance. In description below, the Y light emitting layer 61, the charge generation layer 62, and the B light emitting layer 63 which are regions that emit light when a potential difference is supplied will also be referred to collectively as a light emitting unit 69. The organic EL element 60 is configured to be capable of emitting white light from the whole light emitting unit 69 when the Y light emitting layer 61 and the B light emitting layer 63 emit light at the same time.

The charge generation layer 62 is an intermediate layer which is provided between the Y light emitting layer 61 and the B light emitting layer 63, and has a function of injecting electric charge into the Y light emitting layer 61 and the B light emitting layer 63 when a potential difference is supplied between the anode and the cathode 64. As electric charge generated by the charge generation layer 62 is injected into at least one of the Y light emitting layer 61 and the B light emitting layer 63, more efficient light emission is realized.

Although FIG. 1 illustrates a configuration of one organic EL element 60 for simplification, a plurality of organic EL elements 60 may be formed on a substrate (not illustrated) composed of, for example, a glass material, a resin-based (plastic-based) material, or the like in reality. On the substrate, a pixel separation film 65 in which a plurality of opening portions are provided at predetermined positions is stacked, and the Y light emitting layer 61 is formed to be embedded in the opening portion of the pixel separation film 65 as shown in FIG. 1. The opening portions provided in the pixel separation film 65 correspond to light emission regions of each organic EL element 60. The pixel separation film 65 is composed of an insulating material, and due to the pixel separation film 65, an insulation property against adjacent organic EL elements 60 and insulation between the anode and the cathode 64 are ensured. As above, the pixel separation film 65 has the function of compartmentalizing and thereby separating the plurality of organic EL elements 60 which can be formed to be arrayed on a substrate, for example, in units of pixels.

So far, the schematic configuration of the general organic EL element 60 has been described with reference to FIG. 1. The present inventors have produced a plurality of samples of the general organic EL element 60 having the configuration exemplified in FIG. 1, and conducted examinations of light emission characteristics thereof.

Figure 2:
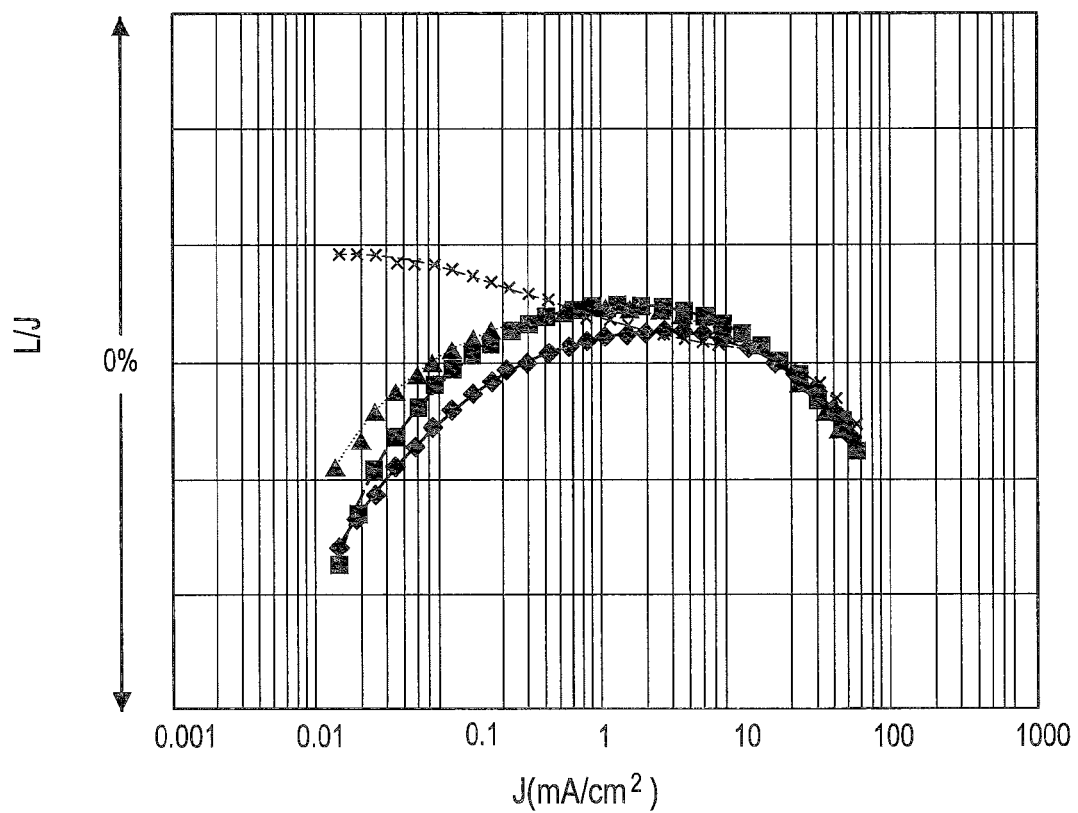
FIG. 2 is a graph showing a relation between light emission luminance and light emission color of the general organic EL element.
Figure 3:
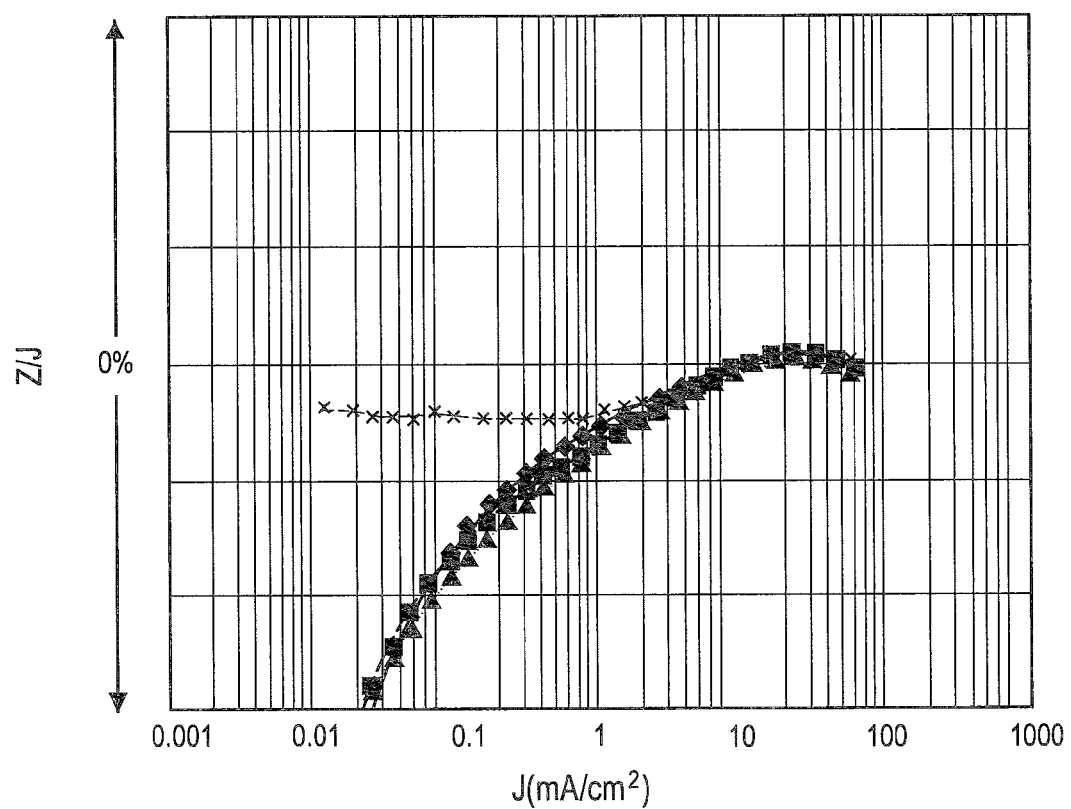
FIG. 3 is a graph showing a relation between light emission luminance and light emission color of the general organic EL element.
Figure 4:
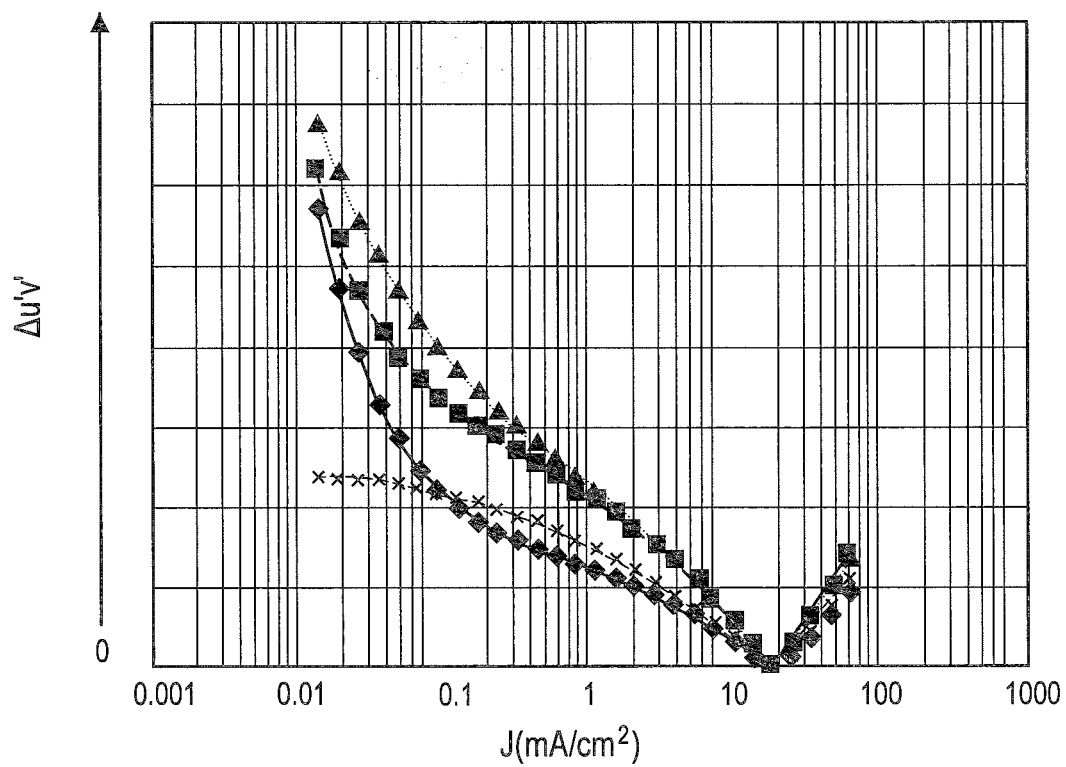
FIG. 4 is a graph showing a relation between light emission luminance and light emission color of the general organic EL element.

Results of measurement performed for the light emission characteristics of the general organic EL element 60 will be described with reference to FIGS. 2 to 4. FIGS. 2 to 4 are graphs showing relations between light emission luminance and light emission colors of the general organic EL element 60.

In FIGS. 2 to 4, the horizontal axis represents current density J (mA/cm$^2$) applied to drive the general organic EL element 60. Since light emission luminance of the organic EL element 60 is proportional to the value of the applied current density J, the horizontal axis shown in FIGS. 2 to 4 can be said to indicate light emission luminance of the organic EL element 60. In a light emitting panel in which the organic EL element 60 that the present inventors used in the examinations is mounted, luminance of the light emission panel when, for example, J=0.01 (mA/cm$^2$) was about 0.3 (nt) (nt=cd/cm$^2$). When a current density J increases by a factor of 10, light emission luminance also increases by a factor of about 10, and thus J=1 (mA/cm$^2$), for example, can be said to correspond to luminance of the light emission panel of 30 (nt).

In addition, in FIG. 2, the vertical axis represents a change ratio of L that is a value indicating a yellow component in a color system that expresses a color space to the current density J (L/J). FIG. 2 can be said to mainly indicate a characteristic of a change in the light emission color of the Y light emitting layer 61. In addition, in FIG. 3, the vertical axis represents a change ratio of Z that is a value indicating a blue component in the color system to the current density J (Z/J). FIG. 3 can be said to mainly indicate a characteristic of a change in the light emission color of the B light emitting layer 63. Further, in FIG. 4, the vertical axis represents Δu'v' that is a value that indicates a color difference in the color system. FIG. 4 can be said to indicate a characteristic of a change in a light emission color of the whole light emitting unit 69. Note that the value (L/J (%)) of the vertical axis of FIG. 2 and the value (Z/J (%)) of the vertical axis of FIG. 3 are standardized to have the value of 0% when J=15 (mA/cm$^2$) (which corresponds to about 450 (nt)). In addition, a value (Δu'v') of the vertical axis of FIG. 4 indicates a color difference based on a standard of a light emission color when J=15 (mA/cm$^2$).

Referring to FIGS. 2 and 3, it is found that, as the current density J, i.e., light emission luminance, changes in the general organic EL element 60, light emission colors of the Y light emitting layer 61 and the B light emitting layer 63 also change. Particularly, the change in the light emission colors in low luminance is remarkable. Further, it is found from FIGS. 2 and 3 that dependency of a change in a light emission color on light emission luminance differs from the samples. The difference between the samples is considered to be caused by, for example, unevenness in manufacturing or the like in a manufacturing process of the organic EL element 60. In addition, referring to FIG. 4, it is found that the color difference increases in low luminance in all samples. Due to the characteristics shown in FIGS. 2 to 4, a phenomenon of a light emission color changing from white to yellow in the low luminance was observed in the general organic EL element 60.

Hereinabove, the results of the measurement performed with respect to light emission characteristics of the general organic EL element 60 have been described with reference to FIGS. 2 to 4. As described above, both of the light emission color of the Y light emitting layer 61 and the light emission color of the B light emitting layer 63 change according to a change in light emission luminance. Thus, if light emission luminance is changed in the general organic EL element 60, the color of white light emitted from the entire light emitting unit 69 also changes, and accordingly it is difficult to emit uniform white light over a wide range of light emission luminance levels. In addition, it was found that dependency of the light emission colors of the Y light emitting layer 61 and the light emission color of the B light emitting layer 63 on light emission luminance differ from the samples. Minimizing unevenness in manufacturing in the manufacturing process of the organic EL element 60 as much as possible is considered to be effective in suppressing unevenness between the samples; however, enormous costs are required to improve the manufacturing process to suppress unevenness in manufacturing to the minimum.

Thus, in order to obtain knowledge for suppressing a color change in the organic EL element 60 using an easier method, the present inventors have produced an organic EL element for testing by variously modifying the structure of the organic EL element 60, and conducted experiments to investigate the light emission characteristic thereof. Exclusive knowledge for suppressing a color change has been obtained as a result of measurement performed on the organic EL element for testing that has a certain configuration.

Figure 5:
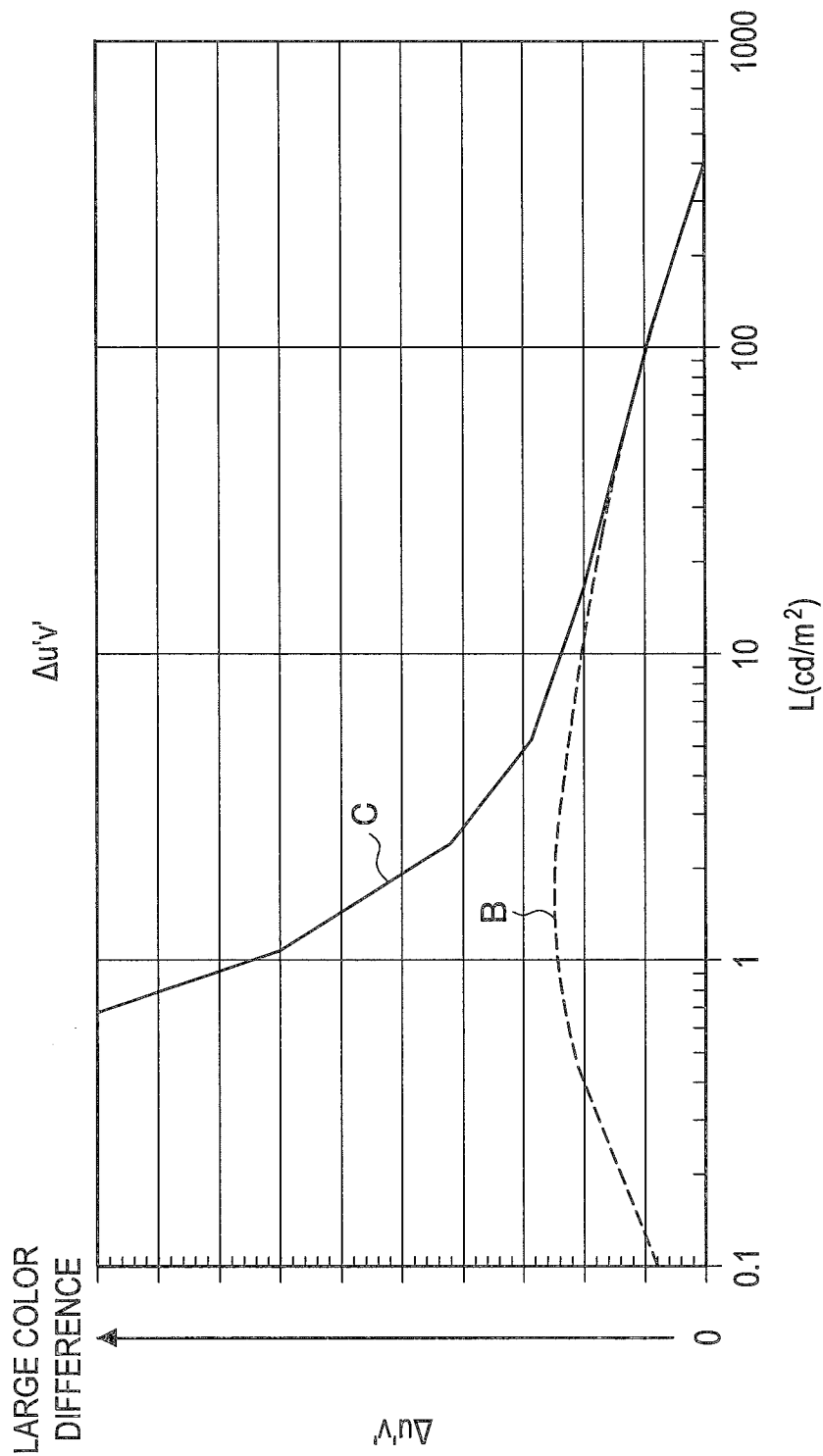
FIG. 5 is a graph showing a light emission characteristic of an organic EL element for testing produced by electrically connecting a charge generation layer to a cathode in the general organic EL element.

As a part of the experiments, the present inventors have produced an organic EL element for testing by electrically connecting the charge generation layer 62 to the cathode 64 in the organic EL element 60 with the configuration exemplified in FIG. 1, and measured a light emission characteristic thereof. The result of the measurement is shown in FIG. 5. FIG. 5 is a graph showing the light emission characteristic of the organic EL element for testing produced by electrically connecting the charge generation layer 62 to the cathode 64 in the organic EL element 60. In FIG. 5, the horizontal axis represents luminance L ($cd/m^2$=nt) of a light emission panel in which the organic EL element is mounted, the vertical axis represents $\Delta u'v'$ that is a value indicating a color difference in light emission from the light emitting unit 69 as in FIG. 4, and a relation of both values is plotted. Note that, in FIG. 5, a value ($\Delta u'v'$) of the vertical axis indicates a color difference based on a standard of a light emission color when L=450 ($cd/m^2$) (which corresponds to about J=15 ($mA/cm^2$)) as in FIG. 4.

In FIG. 5, a curve that indicates the characteristic of the general organic EL element 60 shown in FIG. 4 is plotted together for comparison. In the drawing, the curve B shows the characteristic of the general organic EL element 60 that the charge generation layer 62 is electrically insulated against the cathode 64 in regions other than the B light emitting layer 63. In other words, the curve B corresponds to re-illustration of the dependency of a color difference in the general organic EL element 60 on light emission luminance shown in FIG. 4. On the other hand, the curve C indicates a characteristic of the organic EL element for testing in which the charge generation layer 62 is electrically connected to the cathode 64.

Referring to FIG. 5, it is found that a change in a color difference according to a luminance change is greater in the organic EL element for testing in which the charge generation layer 62 is electrically connected to the cathode 64 than in the general organic EL element 60 as indicated by the curves B and C. To be specific, it is found that, as luminance decreases, the color difference becomes greater in the organic EL element for testing than in the general organic EL element 60. The phenomenon of a light emission color of the whole organic EL element 60 changing from white to yellow in low luminance was observed in the organic EL element for testing more remarkably than in the general organic EL element 60.

Figure 6:
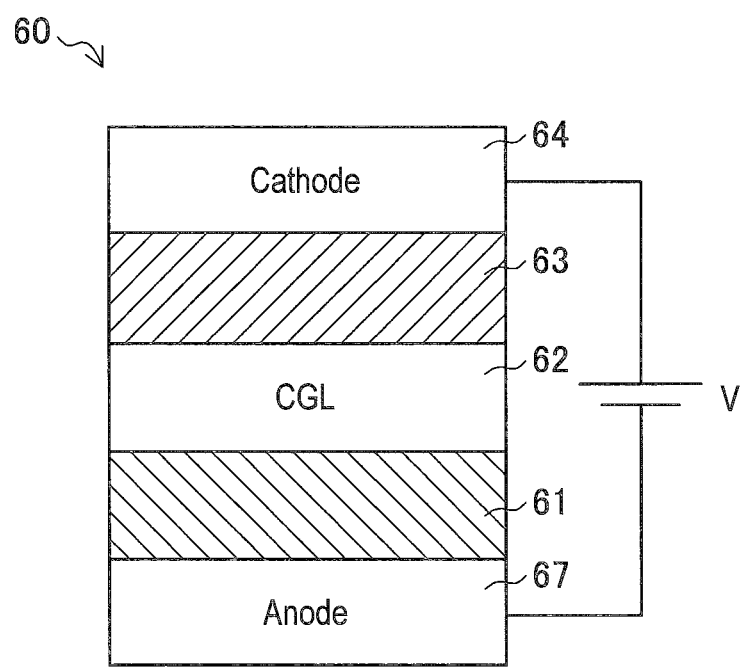
FIG. 6 is an illustrative diagram for describing a light emission characteristic of the general organic EL element.
Figure 7:
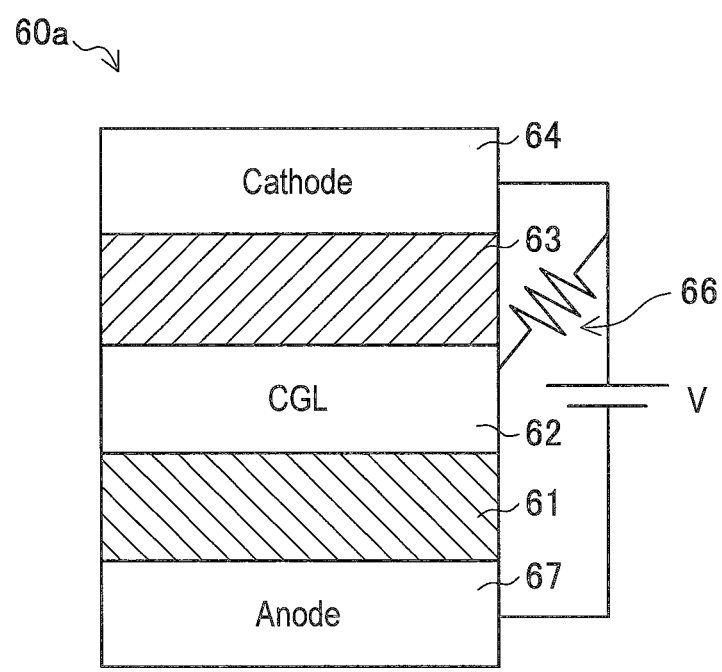
FIG. 7 is an illustrative diagram for describing a light emission characteristic of an organic EL element for testing in which a charge generation layer and a cathode are electrically connected to each other.

The present inventors have contemplated the cause of the difference between the general organic EL element 60 and the organic EL element for testing shown in FIG. 5. The result of the contemplation will be described with reference to FIGS. 6 and 7. FIG. 6 is an illustrative diagram for describing a light emission characteristic of the general organic EL element 60. FIG. 7 is an illustrative diagram for describing a light emission characteristic of an organic EL element for testing 60a in which the charge generation layer 62 and the cathode 64 are electrically connected to each other. Note that, in FIGS. 6 and 7, the anode that is formed in the lower layer of the Y light emitting layer 61, which is not illustrated in FIG. 1, is also illustrated.

First, a degree of chromaticity of light emission of the Y light emitting layer 61 and the B light emitting layer 63 when a current density is low, in other words, when luminance is low in the general organic EL element 60 shown in FIG. 6, will be described. In the case of low luminance, a decrease rate of chromaticity of blue is greater than a decrease rate of chromaticity of yellow as shown in FIGS. 2 and 3. Thus, the Y light emitting layer 61 and the B light emitting layer 63 emit light when a predetermined potential difference V is supplied between the cathode 64 and the anode 67 as shown in FIG. 6; however, when luminance is low, chromaticity of blue light emission of the B light emitting layer 63 is lower than chromaticity of yellow light emission of the Y light emitting layer 61, and thus the organic EL element 60 emits yellowish light as a whole.

Next, a degree of chromaticity of light emission of the Y light emitting layer 61 and the B light emitting layer 63 when a current density is high, in other words, when luminance is high in the general organic EL element 60 shown in FIG. 6, will be described. In the case of high luminance, the difference between a change rate of chromaticity of blue and a change rate of chromaticity of yellow is smaller than in the case of low luminance as shown in FIGS. 2 and 3. Thus, when luminance is high, chromaticity of blue light emission of the B light emitting layer 63 is substantially the same as that of yellow light emission of the Y light emitting layer 61, and thus the organic EL element 60 emits white light as a whole.

On the other hand, FIG. 7 shows a schematic configuration of a stacking structure of the organic EL element for testing 60a in which the charge generation layer 62 and the cathode 64 are electrically connected to each other. First, a degree of chromaticity of light emission of the Y light emitting layer 61 and the B light emitting layer 63 when a current density is low, in other words, when luminance is low in the organic EL element for testing 60a shown in FIG. 7, will be described. Referring to FIG. 7, the Y light emitting layer 61 and the B light emitting layer 63 also emit light when the predetermined potential difference V is supplied between the cathode 64 and the anode 67 in the organic EL element for testing 60a as in the general organic EL element 60. Here, since the organic EL element for testing 60a has the configuration in which the charge generation layer 62 and the cathode 64 are electrically connected to each other, the charge generation layer 62 and the cathode 64 can be regarded as being electrically connected to each other via a resistance 66 that has a predetermined resistance value as shown in FIG. 7. As above, a leak path that has the resistance 66 thereon is formed between the charge generation layer 62 and the cathode 64 in the organic EL element for testing 60a, and thus, when the same voltage V is applied between the cathode 64 and the anode 67, potential of the charge generation layer 62 changes to a value different from that of the general organic EL element 60. As a result, the organic EL element for testing 60a that the present inventors used in the experiments is considered to have a smaller potential difference supplied to the B light emitting layer 63 than the general organic EL element 60, and also to have lower chromaticity of blue light emission of the B light emitting layer 63 than the general organic EL element 60. The organic EL element for testing 60a has a color difference that increases more than in the general organic EL element 60 as luminance decreases as shown in FIG. 5, and thus a phenomenon in which a light emission color changes from white to yellow is found; however, the phenomenon is considered to be triggered by the leak path that has the resistance 66 thereon placed between the charge generation layer 62 and the cathode 64.

Next, a degree of chromaticity of light emission of the Y light emitting layer 61 and the B light emitting layer 63 when a current density is high, in other words, when luminance is high in the organic EL element for testing 60a shown in FIG. 7, will be described. When a current density is high, the value of the potential difference V supplied between the cathode 64 and the anode 67 is greater than when a current density is low. Thus, even though the leak path that has the resistance 66 thereon is formed between the charge generation layer 62 and the cathode 64, only a voltage value sufficient to realize blue light emission with desired chromaticity can be applied to the B light emitting layer 63 stacked in the upper stage. Therefore, when luminance of the organic EL element for testing 60a is high, a change in chromaticity is suppressed in a small range as shown in FIG. 5, and the organic EL element for testing 60a is considered to emit white light as a whole.

So far, the results of examinations that the present inventors have conducted for the general organic EL element 60 have been described. The results of the examination are summarized as follows.

With respect to the general organic EL element 60 configured to emit white light having the structure in which the Y light emitting layer 61 and the B light emitting layer 63 are stacked in this order from the anode 67 side, the present inventors have measured changes of chromaticity of light emitted from the Y light emitting layer 61 and the B light emitting layer 63 while light emission luminance is changed. As a result, it was found that a significant difference had occurred between the change rate of chromaticity of yellow light emission of the Y light emitting layer 61 and the change rate of chromaticity of blue light emission of the B light emitting layer 63 particularly in the case of low luminance and white light had not been maintained. Specifically, in the general organic EL element 60 used in the experiment, the decrease rate of chromaticity of blue light emission in low luminance was noticeable, and thus it was found that, when luminance is low, the general organic EL element 60 emits yellowish light as a whole.

In order to obtain knowledge for suppressing a color change in white light over a wider range of light emission luminance levels using an easier method, the present inventors have produced the organic EL element for testing by variously modifying the structure of the organic EL element 60, and conducted the experiment to investigate the light emission characteristic thereof. As a result, it was found that, in the organic EL element for testing 60a in which the charge generation layer 62 and the cathode 64 are electrically connected to each other, the phenomenon in which the decrease rate of chromaticity of blue light emission in low luminance is more noticeable occurred. The phenomenon is assumed to be caused by the fact that the leak path that has the resistance 66 thereon having a predetermined resistance value is formed between the charge generation layer 62 and the cathode 64, the potential of the charge generation layer 62 is thereby changed to a value different from that of the general organic EL element 60, the potential difference supplied to the B light emitting layer 63 resultantly further decreases, and thereby light emission luminance of the B light emitting layer 63 is further suppressed.

The results of the examinations above indicate that, by appropriately controlling the potential of the charge generation layer 62 to be potential between that of the anode 67 and that of the cathode 64, the potential difference supplied to the Y light emitting layer 61 and/or the B light emitting layer 63 can be controlled, and chromaticity of a light emission color particularly in low luminance can be adjusted. As a result of seriously reviewing the indications over and over, the present inventors have attained an organic EL element according to preferred embodiments of the present disclosure. To be specific, in the preferred embodiments of the present disclosure, an organic EL element, which includes a light emitting unit which has at least a plurality of light emitting layers each containing an organic compound and emitting light upon application of a predetermined potential difference and a charge generation layer which is arranged between the light emitting layers and injects electric charge into the light emitting layers; an anode and a cathode between which the light emitting unit is interposed in the stacking direction and which supply the predetermined potential difference to the light emitting unit; and a potential control mechanism that performs control such that potential of the charge generation layer is set to potential between that of the anode and that of the cathode, is provided. Hereinbelow, the preferred embodiments of the present disclosure will be described in detail.

2. First Embodiment

As described in <1. Examination of a general organic EL element>, the result of the examination of the general organic EL element 60 indicates that the potential difference supplied to the Y light emitting layer 61 and/or the B light emitting layer 63 can be controlled by appropriately controlling potential of the charge generation layer 62, and thereby chromaticity of a light emission color of the organic EL element 60 can be adjusted as a whole particularly in low luminance. Here, in the general organic EL element 60, since the chromaticity of yellow light emission of the Y light emitting layer 61 is greater than that of blue light emission of the B light emitting layer 63 particularly in low luminance as described above, the phenomenon in which the color of white light changes to yellow occurs. On the other hand, from the experiment conducted on the organic EL element for testing 60a, it was found that, by forming the leak path that has the resistance 66 thereon between the charge generation layer 62 and the cathode 64, a voltage applied to the B light emitting layer 63 stacked in the upper stage closer to the cathode 64 is weak and thus light emission luminance of the B light emitting layer 63 is suppressed. Based on the aforementioned result, by stacking the Y light emitting layer 61 in the upper stage of the B light emitting layer 63 (on the side closer to the cathode 64) and forming a leak path that has the resistance 66 thereon between the charge generation layer 62 and the cathode 64, a configuration in which light emission luminance of the Y light emitting layer 61 stacked in the upper stage is suppressed and a color change in white light is suppressed over a wider range of light emission luminance levels is considered to be realized.

Based on the results of the examinations, for a stacking-type organic EL element of a first embodiment in which a plurality of organic light emitting layers that emit light having different wavelength bands are stacked having a charge generation layer therebetween, a structure in which the charge generation layer is electrically connected to a cathode via a resistance having a predetermined resistance value (a charge generation layer contact structure) is provided as a potential control mechanism that performs control such that potential of the charge generation layer is between that of an anode and that of the cathode. Hereinbelow, the first embodiment that is a preferred embodiment of the present disclosure will be described in detail.

[2-1. Structure of an Organic EL Element]

Figure 8:
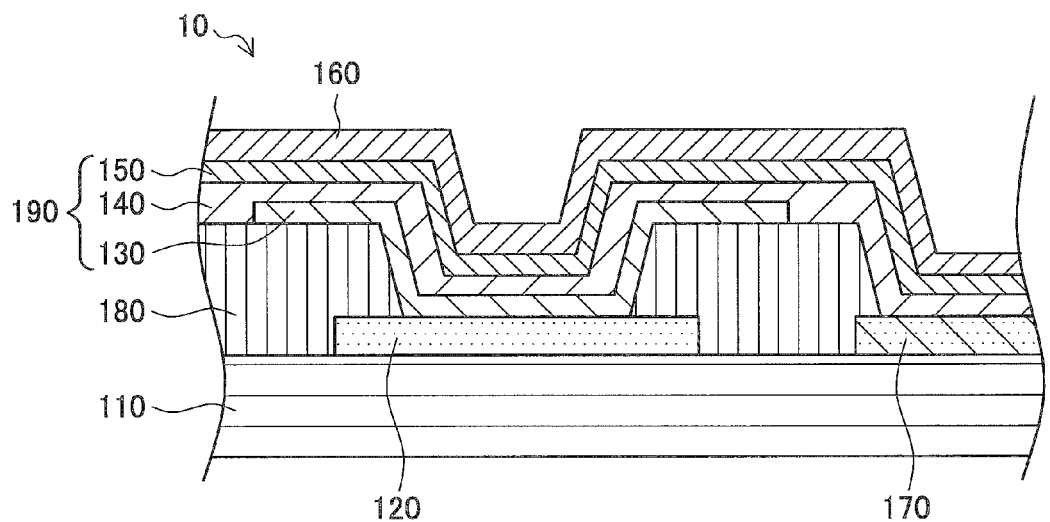
FIG. 8 is a cross-sectional diagram showing a schematic configuration of a stacking structure of an organic EL element according to a first embodiment of the present disclosure.

A configuration example of an organic EL element according to the first embodiment of the present disclosure will be described with reference to FIG. 8. FIG. 8 is a cross-sectional diagram showing a schematic configuration of a stacking structure of an organic EL element according to the first embodiment of the present disclosure.

Referring to FIG. 8, the organic EL element 10 according to the first embodiment has a positive pole 120 (anode 120), a pixel separation film 180, a blue light emitting layer 130 (B light emitting layer 130) which is an organic light emitting layer that contains an organic compound and emits blue light when a predetermined potential difference is supplied, a charge generation layer 140, a yellow light emitting layer 150 (Y light emitting layer 150) which contains an organic compound and emits yellow light when a predetermined potential difference is supplied, and a negative pole 160 (cathode 160) formed to be stacked on a substrate 110 in this order. In addition, the organic EL element 10 has a cathode contact region 170 that is formed, for example, in the same wiring layer as the anode 120 and made of a conductive material.

When a predetermined potential difference is supplied between the anode 120 and the cathode 160, a predetermined potential difference is supplied to the B light emitting layer 130 and the Y light emitting layer 150, both of which are interposed between the anode 120 and the cathode 160, and accordingly the B light emitting layer 130 and the Y light emitting layer 150 each emit light having predetermined wavelength bands with predetermined luminance. In description below, the B light emitting layer 130, the charge generation layer 140, and the Y light emitting layer 150 which are a region in which light emission is performed when a potential difference is supplied will be collectively referred to also as a light emitting unit 190. The organic EL element 10 is configured to be capable of emitting white light from the entire light emitting unit 190 when the B light emitting layer 130 and the Y light emitting layer 150 emit light at the same time. The organic EL element 10, however, may be configured to be capable of emit light having a predetermined wavelength band from the entire light emitting unit 190 when the B light emitting layer 130 and the Y light emitting layer 150 emit light at the same time, and the light emission color may be one other than white.

Note that, for the sake of simplification, FIG. 8 illustrates the configuration of one organic EL element 10 formed on the substrate 110; however, a plurality of organic EL elements 10 can be arrayed on the substrate 110 in reality depending on an application thereof. Further, a region that includes the plurality of arrayed organic EL elements 10 can be compartmentalized to a plurality of regions each including at least one organic EL element 10 and each compartmentalized region can function as a pixel. Hereinbelow, each constituent member will be described in detail.

(Substrate 110)

The substrate 110 is a supporting body that has the organic EL element 10 formed on its surface. As materials of the substrate 110, for example, various know materials including quartz, glass, metallic foil, a film or a sheet formed of a resin-based material, and the like may be used. As the resin-based materials, for example, methacrylic resins represented by polymethyl methacrylate (PMMA), polyesters such as polyethylene terephthalate (PET), polyethylene naphthalate (PEN), and polybutylene naphthalate (PBN), a polycarbonate resin, a silicon resin, and the like are exemplified. As the substrate 110, one formed of the resin-based materials in a stacking structure, or one obtained by performing various kinds of surface processing on the resin-based materials in order to suppress water permeability and gate permeability may be used. In addition, when the organic EL element 10 is used for each pixel of a display device which is driven in an active matrix method, the substrate 110 may be provided with a thin film transistor (TFT) for driving the organic EL element 10 in each pixel.

(Anode 120)

The anode 120 is formed by stacking a conductive material on the substrate 110 and then processed to have a predetermined pattern. As a material of the anode 120, one having a relatively high work function from a vacuum level is used in order to inject holes into the B light emitting layer 130 formed on the anode 120 with high efficiency. As a material of the anode 120, for example, a material that includes at least one selected from metals such as aluminum (Al), chromium (Cr), molybdenum (Mo), tungsten (W), copper (Cu), silver (Ag), or gold (Au), alloys thereof, oxides of the metals or alloys thereof, and the like may be used. In addition, as a material of the anode 120, for example, a material that includes at least one selected from an alloy of tin oxide ($SnO_2$) and antimony (Sb), an alloy of indium tin oxide (ITO), indium zinc oxide (InZnO), zinc oxide (ZnO), and aluminum (Al), oxides of the metals or the alloys, and the like may be used.

In addition, the anode 120 may have a configuration in which a first layer having high light reflection property and a second layer that is provided in the upper portion of the first layer and has a light transmission property are stacked. The first layer is formed of, for example, an alloy having aluminum as a main component. An accessory component of the first layer may be one that includes at least one element having a relatively lower work function than the aluminum as the main component. As such an accessory component, a lanthanide is preferably used. When the anode 120 contains a lanthanide, stability thereof improves, and hole injection performance of the anode 120 also improves. In addition, as the accessory component, an element such as silicon (Si), copper, or the like may be contained, in addition to the lanthanide.

The total content of accessory components of the first layer, which are, for example, neodymium (Nd), nickel (Ni), titanium (Ti), and the like that stabilize aluminum, is preferably about 10 weight % or less. Accordingly, the reflectance of the first layer can be maintained, stability of the first layer can be secured during the manufacturing process of the organic EL element 10, and further processing accuracy and chemical stability can also be obtained. In addition, conductivity of the anode 120 and adhesiveness to the substrate 110 can also be improved.

In addition, the second layer can be formed of a material composed of at least one of, for example, an oxide of an aluminum alloy, a molybdenum oxide, zirconium oxide, a chromium oxide, and tantalum oxide. Here, when the second layer is an oxide layer of an aluminum alloy containing a lanthanide-based element as an accessory component (including a natural oxide film), for example, a transmittance of the second layer is retained to be a relatively high value since the transmittance of an oxide of a lanthanide-based element is relatively high. For this reason, the surface of the first layer can maintain a high reflectance.

Here, a conductive layer that improves adhesiveness between the substrate 110 and the anode 120 may be further provided between the substrate 110 and the anode 120. As such a conductive layer, a transparent conductive layer formed of a material such as ITO, or indium zinc oxide (IZO) is exemplified.

In addition, when the organic EL element 10 is used for pixels of a display device driven in the active matrix method, for example, the anode 120 can be patterned so as to be formed having a predetermined area for each pixel, and electrically connected to a TFT (not illustrated) for pixel driving provided on the substrate 110.

(Pixel Separation Film 180)

The pixel separation film 180 is stacked on the anode 120. The pixel separation film 180 secures an insulation property between the anode 120 and the cathode 160 and compartmentalizes a plurality of organic EL elements 10 which can be formed to be arrayed on the substrate 110 in units of, for example, pixels. In the pixel separation film 180, an opening portion is provided in a region corresponding to a light emission region of the organic EL element 10. A formation position of the opening portion corresponds to a formation position of the anode 120 of each pixel, and a surface of the anode 120 of each pixel is exposed from the opening portion. The pixel separation film 180 can be formed of, for example, a photosensitive resin such as a polyimide, an acrylic resin, or a novolac-based resin.

(B Light Emitting Layer 130 and Y Light Emitting Layer 150)

The B light emitting layer 130 is an organic light emitting layer that emits light having a wavelength band corresponding to blue when a predetermined potential difference is supplied between the anode 120 and the cathode 160 and thus holes or electrons injected from each of the anode 120 and the charge generation layer 140 which is an intermediate layer recombine. In addition, the Y light emitting layer 150 is an organic light emitting layer that emits light having a wavelength band corresponding to yellow when a predetermined potential difference is supplied between the anode 120 and the cathode 160 and thus holes or electrons injected from each of the cathode 160 and the charge generation layer 140 which is an intermediate layer recombine. The B light emitting layer 130 and the Y light emitting layer 150 may be formed of a so-called phosphorescent material or a fluorescent material. The B light emitting layer 130 and the Y light emitting layer 150 are composed of a material having high light emission efficiency, for example, an organic light emitting material such as a low-molecular fluorochrome, a fluorescent polymer, or a metal complex.

As a host material of the B light emitting layer 130 and the Y light emitting layer 150, an aromatic hydrocarbon compound composed of, for example, a phenylene nucleus, a naphthalene nucleus, an anthracene nucleus, a pyrene nucleus, a naphthacene nucleus, a chrysene nucleus, or a perylene nucleus may be used. To be specific, as a host material of the B light emitting layer 130 and the Y light emitting layer 150, for example, 9,10-diphenylanthracene, 9,10-di(1-naphthyl)anthracene, 9,10-di(2-naphthyl)anthracene (ADN), 1,6-diphenylpyrene, 1,6-di(1-naphthyl)pyrene, 1,6-di(2-naphthyl), 1,8-diphenylpyrene, 1,8-di(1-naphthyl)pyrene, 1,8-di(2-naphthyl)pyrene, rubrene, 6,12-diphenylchrysene, 6,12-di(1-naphthyl)chrysene, 6,12-di(2-naphthyl)chrysene, or the like can be preferably used.

In addition, for the purpose of control of a light emission spectrum of the B light emitting layer 130 and the Y light emitting layer 150, a guest material is appropriately added thereto. As such a guest material, an organic substance such as a naphthalene derivative, an amine compound, a pyrene derivative, a naphthacene derivative, a perylene derivative, a coumarin derivative, or pyran-based pigment can be used, and among these, an aromatic tertiary amine compound can be preferably used.

Since a combination of various known materials that are used for an organic light emitting layer that emits blue light and an organic light emitting layer that emits yellow light may be used as a host material and a guest material of the B light emitting layer 130 and the Y light emitting layer 150, detailed description thereof will be omitted. As one example, for example, ADN may be used as a host material of the B light emitting layer 130 and the B light emitting layer may be composed of a material obtained by mixing 4,4'-bis[2-{4-(N,N-diphenylamino) phenyl}vinyl]biphenyl (DPAVBi) as a guest material with the host material. In addition, for example, 4,4'-N,N'-dicarbazole-biphenyl (CBP) may be used as a host material of the Y light emitting layer 150, and the Y light emitting layer may be composed of a material obtained by mixing tris(benzo[h]quinoline)iridium (Ir(bzq)$_3$) as a guest material with the host material.

(Charge Generation Layer 140)

The charge generation layer 140 is an intermediate layer arranged between the B light emitting layer 130 and the Y light emitting layer 150, and has a function of injecting electric charge into the B light emitting layer 130 and the Y light emitting layer 150 when a potential difference is supplied between the anode 120 and the cathode 160. In the stacking structure exemplified in FIG. 8, the charge generation layer 140 has the function, when a potential difference is supplied between the anode 120 and the cathode 160, of injecting holes into the Y light emitting layer 150 disposed on the cathode 160 side when viewed from the charge generation layer 140 and injecting electrons into the B light emitting layer 130 disposed on the anode 120 side when viewed from the charge generation layer 140.

As the charge generation layer 140, any of various known configurations used as a layer having the same function in a general organic EL element may be applied. As an example of the charge generation layer 140 according to the first embodiment, a case in which the charge generation layer 140 is configured by a plurality of stacked layers formed of different materials will be described herein. For example, the charge generation layer 140 is configured to have a three-layer structure in which an oxide-containing layer, a charge-transporting organic material layer, and a triphenylene layer are stacked in this order from the anode 120 side. In order to avoid complicating the drawing, however, FIG. 8 illustrates the charge generation layer 140 simplified to have a single-layer structure.

The oxide-containing layer included in the charge generation layer 140 is composed using an oxide that includes at least one of, for example, alkali metals and alkaline earth metals (including beryllium and magnesium). Here, the alkali metals include lithium (Li), sodium (Na), potassium (K), rubidium (Rb), cesium (Cs), and francium (Fr). In addition, the alkaline earth metals include beryllium (Be), magnesium (Mg), calcium (Ca), strontium (Sr), barium (Ba), and radium (Ra).

In addition, the oxide of which the oxide-containing layer is composed may be a general alkali metal oxide, an alkaline earth metal oxide, or a complex oxide that includes at least one of an alkali metal and an alkaline earth metal, and another element. As specific examples of the oxide of which a complex oxide is composed along with the alkali metal and an alkaline earth metal, tetraboric oxide, a germanium oxide, a molybdenum oxide, a niobium oxide, a silicon oxide, tantalum oxide, a titanium oxide, a vanadium oxide, a tungsten oxide, zirconium oxide, a carbon oxide, a hydroxide, chromous oxide, a chromium oxide, dichromic oxide, a ferrite, selenous oxide, selenium oxide, tin oxide, tellurous oxide, tellurium oxide, bismuth oxide, tetraboric oxide, and metaboric oxide can be exemplified, and at least one or more kinds may be selected from these. Among these, $Li_2CO_3$, $Cs_2CO_3$, or $Li_2SiO_3$ is particularly preferably used as a main component.

In addition, the oxide-containing layer may be a mixed layer in which any of the above oxides is mixed with a charge-transporting material. As a charge transporting material of which the mixed layer is composed along with the oxide described above, a hole-transporting material or an electron-transporting material may be used. The oxide-containing layer constituted by the mixed layer can be formed by performing, for example, co-deposition on a charge-transporting organic material such as a hole-transporting material or an electron-transporting material serving as a hopping site of electric charge (i.e., holes or electrons) along with the oxide described above (for example, $Li_2CO_3$).

The charge-transporting organic material layer included in the charge generation layer 140 is a layer that is mainly composed of a charge-transporting organic material, and includes an electron-transporting organic material, a hole-transporting organic material, or a both-charge-transporting organic material. The charge-transporting organic material layer may be a layer composed only of an electron-transporting organic material and/or a hole-transporting organic material that do not include a metallic material or an added ingredient such as a material having a strong electron-attracting property, and may be a mixed layer obtained by mixing an electron-transporting organic material and/or a hole-transporting organic material with at least one of an alkali metal and an alkaline earth metal.

Note that, as an electron-transporting organic material and a hole-transporting organic material that are used as charge-transporting organic materials, for example, the "electron-transporting organic material" and the "hole-transporting organic material" exemplified in JP 2006-351398A that is a preceding application filed by the same applicant as the present application can be used. An electron-transporting organic material and a hole-transporting organic material of which the charge-transporting organic material layer of the charge generation layer 140 of the first embodiment is composed, however, are not limited to those disclosed in the publication, and other materials may be used as long as they are materials having an electron-transporting property and a hole-transporting property.

The triphenylene layer included in the charge generation layer 140 is preferably composed of at least one of, for example, a triphenylene derivative shown in the following formula (I) and an azatriphenylene derivative. Note that the triphenylene derivative is a compound composed of a triphenylene skeleton whose mother skeleton only includes carbon, and the azatriphenylene derivative is a compound composed of an azatriphenylene skeleton whose mother skeleton includes nitrogen in a triphenylene skeleton.

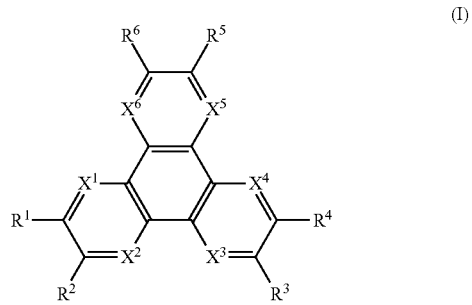

(I)

Here, in the general formula (I), $R^1$ to $R^6$ are independently hydrogen, a halogen, a hydroxyl group, an amino group, an aryl amino group, a substituted or non-substituted carbonyl group having 20 or fewer carbon atoms, a substituted or non-substituted carbonyl ester group having 20 or fewer carbon atoms, a substituted or non-substituted alkyl group having 20 or fewer carbon atoms, a substituted or non-substituted alkenyl group having 20 or fewer carbon atoms, a substituted or non-substituted alkoxyl group having 20 or fewer carbon atoms, a substituted or non-substituted aryl group having 30 or fewer carbon atoms, a substituted or non-substituted heterocyclic group having 30 or fewer carbon atoms, a nitrile group, a nitro group, a cyano group, or a silyl group. In addition, among $R^1$ to $R^6$, adjacent Rms (m=1 to 6) may bond to each other through a cyclic structure. Further, in the general formula (I), $X^1$ to $X^6$ are independently a carbon atom or a nitrogen atom.

Here, the triphenylene layer can be composed of at least one of the triphenylene derivative and the azatriphenylene derivative exemplified above or a combination thereof. In addition, the triphenylene layer may contain, for example, an aromatic amine having a hole-transporting property, in addition to the triphenylene derivative or the azatriphenylene derivative.

So far, the compositions of the oxide-containing layer, the charge-transporting organic material layer, and the triphenylene layer of which the charge generation layer 140 is composed have been described. Here, the above-described oxide-containing layer, the charge-transporting organic material layer, and the triphenylene layer may not necessarily have clearly separated compositions, and materials of which the layers are composed may be mixed together on interfaces thereof. For example, the material of which the charge-transporting organic material layer is composed may be included in the oxide-containing layer, and conversely, the material of which the oxide-containing layer is composed may be included in the charge-transporting organic material layer. Further, on each of the interfaces of the charge-transporting organic material layer, a mixed layer with the material of which the triphenylene layer is composed positioned in the upper layer of the charge-transporting organic material layer and a mixed layer with the material of which the oxide-containing layer is composed positioned in the lower layer thereof may be provided.

As described above, the organic EL element 10 has the configuration in which the charge generation layer 140 formed by stacking the oxide-containing layer and the charge-transporting organic material layer is interposed between the B light emitting layer 130 and Y light emitting layer 150. Thereby, efficiency of injecting electrons from the charge generation layer 140 into the B light emitting layer 130 arranged on the anode 120 side improves. By stacking the B light emitting layer 130 and Y light emitting layer 150 with the charge generation layer 140 therebetween as above, the organic EL element 10 that is a stacking-type organic EL element can be driven more stably.

Note that, for the configuration of the charge generation layer 140 according to the first embodiment, the configurations of the "connection layer" and "intermediate layer" disclosed in JP 2006-324016A, JP 2006-351398A, JP 2010-192366A, and the like that are preceding applications filed by the same applicant as the present application can be referred to.

(Cathode 160)

The cathode 160 is configured in a double-layer structure in which, for example, a first layer and a second layer are stacked in order from the Y light emitting layer 150 side. In order to avoid complicating the drawing, FIG. 8 illustrates the cathode 160 simplified to have a single-layer structure.

The first layer is formed of a material having a relatively low work function and favorable light transmission property. Examples of such a material may include, for example, the oxide of lithium, or lithium oxide ($Li_2O$), the oxide of cesium, or cesium oxide ($Cs_2O$), or a mixture of the oxides. The first layer, however, is not limited to having any of these materials, and as a material of the first layer, for example, an alkaline earth metal such as calcium or barium, an alkali material such as lithium or cesium, a material having a relatively low work function such as indium (In) or magnesium, a single substance such as an oxide of these metals, or a mixture or an alloy of any of the metals and an oxide can be used.

The second layer is constituted by, for example, a thin film of MgAg or the like using a layer having a light transmission property. In addition, the second layer may be a mixed layer that contains an organic light emitting material such as an aluminum quinoline complex, a styrylamine derivative, or a phthalocyanine derivative. In such a case, the cathode 160 may further have a layer of MgAg having a light transmission property as a third layer separately.

Each layer of the cathode 160 described above can be formed using various methods such as a vacuum deposition method, a sputtering method, a plasma CVD method, and the like. When the organic EL element 10 is used in a display device driven in the active matrix method, the cathode 160 may be formed as a solid film on the substrate 110 in a state in which it is electrically insulated against the anode 120 by the pixel separation film 180 and used as a common electrode of each pixel.

Here, the anode 120 and the cathode 160 are not limited to having the configuration described above, and an optimum configuration may be selected according to a configuration of a device, a module, an electronic apparatus, or the like in which the organic EL element 10 is mounted. For example, a case in which the organic EL element 10 is used as a light emitting element constituting a pixel of a display device is considered. When the display device is a bottom-emission type (lower-surface light emission type) in which light generated by the organic EL element 10 is discharged from the substrate 110 side, the anode 120 may be configured to be a transparent conductive film, for example, a single-layer film composed of any of ITO, IZO, and the like or a stacked film composed of two or more kinds of these. On the other hand, when the display device is a top emission type (top-surface light emission type) in which light generated by the organic EL element 10 is discharged from the opposite side to the substrate 110, the cathode 160 may be constituted by the transparent conductive film described above. In this manner, the configurations of the anode 120 and the cathode 160 may be appropriately designed taking physical features relating to light emission of the B light emitting layer 130 and the Y light emitting layer 150 as well as configurations of devices, modules, and electronic apparatuses in which the organic EL element 10 is mounted into account.

(Cathode Contact Region 170)

The cathode contact region 170 is a wiring pattern formed of a conductive material and is a region having the same potential as the cathode 160 by being electrically connected to the cathode 160. In the example shown in FIG. 8, the cathode contact region 170 is a wiring pattern formed in the same layer as the anode 120 in the same step as the anode 120, and is electrically connected to the cathode 160 via, for example, a via-hole (not illustrated) while being electrically insulated against the anode 120. The cathode contact region 170 can function as, for example, an electrode for supplying predetermined potential to the cathode 160.

Here, in the first embodiment, the organic EL element 10 is configured such that the cathode contact region 170 comes in electrical contact with the charge generation layer 140. Specifically, in the position of the pixel separation film 180 in which the cathode contact region 170 is formed, an opening portion from which a surface of the cathode contact region 170 is exposed is provided as shown in FIG. 8. In addition, the B light emitting layer 130 is not formed at least in the position corresponding to the opening portion, and the charge generation layer 140 is embedded in the opening portion so as to come in contact with the cathode contact region 170. Accordingly, the charge generation layer 140 and the cathode contact region 170 (in other words, the charge generation layer 140 and the cathode 160) are electrically connected to each other in the opening portion.

Here, the charge generation layer 140 has a sheet resistance value according to its material. In addition, contact resistance occurs on the contact face of the charge generation layer 140 and the cathode contact region 170 or the contact portion of the cathode 160 and the cathode contact region 170 via the above-described via-hole. Thus, the organic EL element 10 has a structure in which the charge generation layer 140 and the cathode 160 are electrically connected to each other via a resistance having a predetermined resistance value (which will also be referred to hereinafter as a charge generation layer contact structure). In the first embodiment, the charge generation layer contact structure functions as a potential control mechanism that controls potential of the charge generation layer 140.

As described in <1. Examination of a general organic EL element>, the present inventors have found from the experiment performed on the organic EL element for testing 60a that, when the leak path having the resistance 66 with a predetermined resistance value thereon is formed between the charge generation layer 62 and the cathode 64 in the general organic EL element 60 having the configuration illustrated in FIG. 1, a voltage applied to the light emission layer stacked in the upper stage becomes weak and thus light emission luminance of the light emission layer is suppressed. Since the organic EL element 10 according to the first embodiment shown in FIG. 8 has the configuration in which the Y light emitting layer 150 is stacked in the upper stage of the B light emitting layer 130 and a leak path having a resistance with a predetermined resistance value thereon is formed between the charge generation layer 140 and the cathode 160, the effects that light emission luminance of the Y light emitting layer 150 stacked in the upper stage is suppressed and a color change of white light is suppressed over a wider range of light emission luminance levels can be obtained.

Here, in the first embodiment, by appropriately adjusting parameters such as the material of the charge generation layer 140, the thickness of the charge generation layer 140, and roughness of the contact face of the charge generation layer 140 and the cathode contact region 170, the resistance value between the charge generation layer 140 and the cathode 160 can be controlled. The resistance value increases when the charge generation layer 140 is thicker and the contact face of the charge generation layer 140 and the cathode contact region 170 is rougher. For example, the charge generation layer 140 is preferably formed to have a thickness of about 2 to 30 nm of a material having a sheet resistance value of about $1 \times 10^8$ to $1 \times 10^{14}$ ($\Omega$/□).

In addition, in order to control the resistance value, parameters such as the formation position of the cathode contact region 170 (the distance from the formation position of the anode 120 to the cathode contact region 170), and the thickness of the pixel separation film 180 (the undulation from the opening portion corresponding to the formation position of the anode 120 to the opening portion corresponding to the formation position of the cathode contact region 170) may be further adjusted. The adjustment of the parameters corresponds to adjustment of the length (area) of the charge generation layer 140, and the resistance value between the charge generation layer 140 and the cathode 160 increases when the length (area) of the charge generation layer 140 is longer (increases). Note that, in reality, taking the potential difference supplied when the organic EL element 10 is driven, the size of the organic EL element 10, and the like which can be decided according to the application of the organic EL element 10 into account, an optimum resistance value that enables a color change of white light to be controlled more satisfactorily over light emission luminance levels to be used may be designed, and the aforementioned various parameters may be designed to realize the resistance value.

So far, the configuration example of the organic EL element 10 according to the first embodiment has been described with reference to FIG. 8. Note that the configuration illustrated in FIG. 8 is merely one configuration example of the organic EL element 10 according to the first embodiment, and the organic EL element 10 may have another configuration. For example, the organic EL element 10 may be further provided with various known layers used in general organic EL elements including a hole injection layer, a hole transport layer, an electron injection layer, an electron transport layer, and the like, in addition to the layers shown in FIG. 8. Inclusion and omission of the layers and positions at which the layers are added may be appropriately set according to applications of the organic EL element 10, the configuration and the function of the light emitting unit 190, and the like.

In addition, in the example shown in FIG. 8, although the cathode contact region 170 that is in electrical continuity with the cathode 160 is provided in the same wiring layer as the anode 120, and the charge generation layer 140 and the cathode 160 are electrically connected to each other via the resistance having a predetermined resistance value as the charge generation layer 140 and the cathode contact region 170 are in contact with each other, the first embodiment is not limited thereto. In the first embodiment, the charge generation layer 140 and the cathode 160 may be electrically connected to each other via the resistance having a predetermined resistance value, and a specific connection position thereof and a configuration for causing the connection may be appropriately set taking formation positions of other layers and the like into account.

[2-2. Comparison to General Organic EL Elements]

Figure 9:
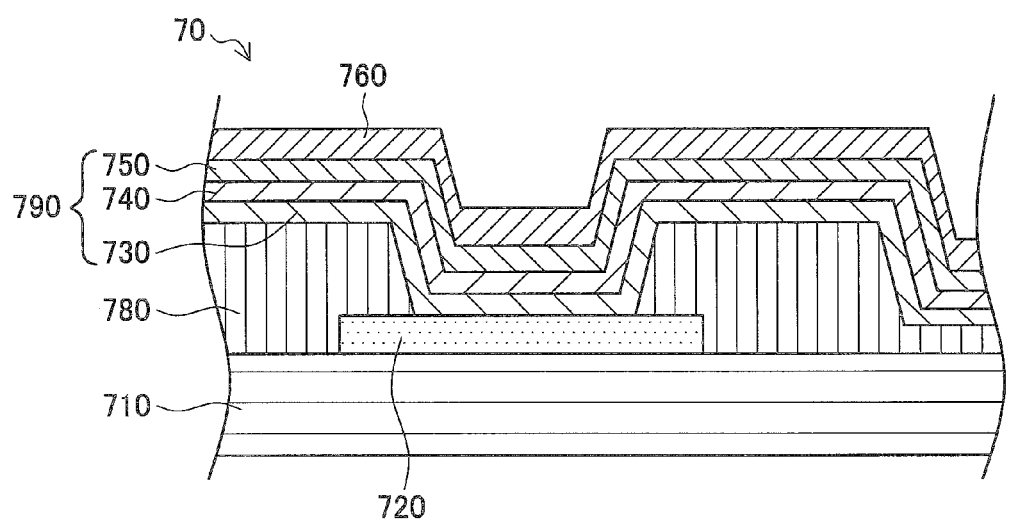
FIG. 9 is a cross-sectional diagram showing a schematic configuration of a stacking structure of a general organic EL element.
Figure 10:
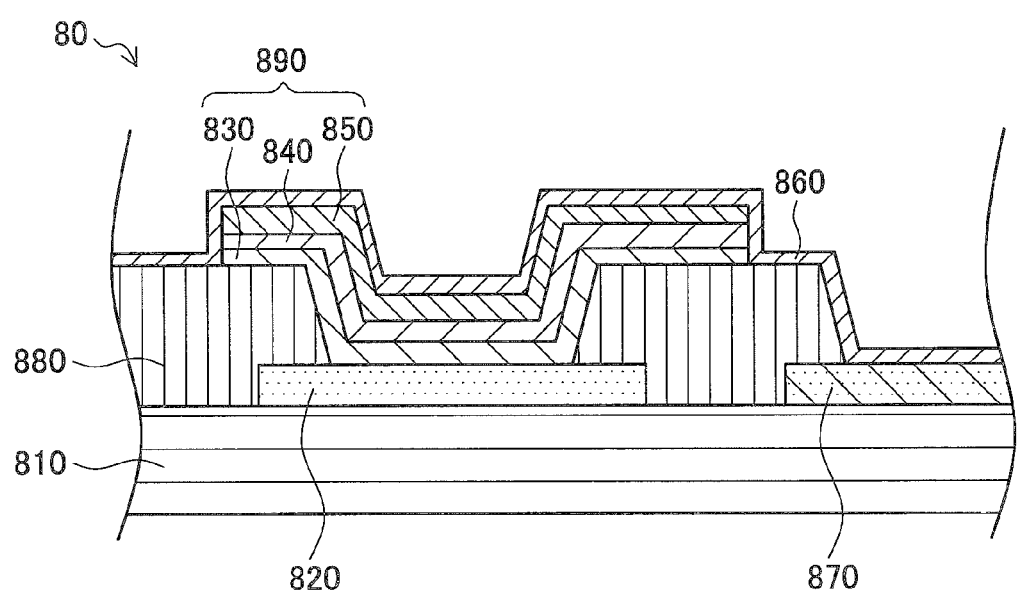
FIG. 10 is a cross-sectional diagram showing a schematic configuration of a stacking structure of a general organic EL element.

Herein, in order to additionally clarify the first embodiment, the organic EL element 10 described above and general organic EL elements will be compared. For the comparison, schematic configurations of the general organic EL elements will be described again with reference to FIGS. 9 and 10. FIGS. 9 and 10 are cross-sectional diagrams showing the schematic configurations of stacking structures of the general organic EL elements. Here, the general organic EL element 60 exemplified in FIG. 1 described above is a stacking-type organic EL element in which the Y light emitting layer 61 is arranged in the lower layer and the B light emitting layer 63 in the upper layer. On the other hand, FIGS. 9 and 10 illustrate the schematic configurations of the general stacking-type organic EL elements corresponding to the organic EL element 10 according to the first embodiment shown in FIG. 8 in which B light emitting layers are arranged in the lower layer and Y light emitting layers in the upper layer.

Referring to FIG. 9, the general organic EL element 70 is formed such that an anode 720, a pixel separation film 780, the B light emitting layer 730, a charge generation layer 740, the Y light emitting layer 750, and a cathode 760 are stacked on a substrate 710 in this order. When a predetermined potential difference is supplied between the anode 720 and the cathode 760, a predetermined potential difference is supplied to the B light emitting layer 730 and the Y light emitting layer 750 interposed between the anode 720 and the cathode 760, and thereby the B light emitting layer 730 and the Y light emitting layer 750 each emit light having a predetermined wavelength band with predetermined luminance. In description below, the B light emitting layer 730, the charge generation layer 740, and the Y light emitting layer 750 which are regions in which light emission is performed according to application of a voltage will also be collectively referred to as a light emitting unit 790. The organic EL element 70 is configured such that the light emitting unit 790 can emit white light as a whole when the B light emitting layer 730 and the Y light emitting layer 750 emit light at the same time.

Here, since the substrate 710, the anode 720, the pixel separation film 780, the B light emitting layer 730, the charge generation layer 740, the Y light emitting layer 750, and the cathode 760 may be constituent elements having the same functions as the substrate 110, the anode 120, the pixel separation film 180, the B light emitting layer 130, the charge generation layer 140, the Y light emitting layer 150, and the cathode 160 of the organic EL element 10 according to the first embodiment shown in FIG. 8, detailed description thereof will be omitted. The general organic EL element 70, however, is different from the organic EL element 10 according to the first embodiment in that a configuration corresponding to the cathode contact region 170 is not provided, and the B light emitting layer 730, the charge generation layer 740, the Y light emitting layer 750, and the cathode 760 are stacked on the anode 720 and the pixel separation film 780 as uniform films (solid films) as shown in FIG. 9.

As described above, the general organic EL element 70 having the configuration exemplified in FIG. 9 is not provided with a potential control mechanism that controls potential of the charge generation layer 740. Thus, securing chromaticity of blue light emission by the B light emitting layer 730 and chromaticity of yellow light emission by the Y light emitting layer 750 at a predetermined ratio over a wide range of light emission luminance levels of the light emitting unit 790 is considered to be difficult. In addition, in the configuration shown in FIG. 9, the cathode 760 is also provided as the solid film and thus used as, for example, a common electrode for a plurality of pixels. For this reason, the area of the cathode 760 increases when the number of pixels increases, and thus a sheet resistance component is not negligible. If a resistance value of the cathode 760 increases, there is a possibility of a delay of a current, and accordingly unstable driving of the organic EL element 70 is a concern.

On the other hand, FIG. 10 shows the stacking structure of the other general organic EL element having a different configuration from that shown in FIG. 9. Referring to FIG. 10, the general organic EL element 80 is formed such that an anode 820, a pixel separation film 880, the B light emitting layer 830, a charge generation layer 840, the Y light emitting layer 850, and a cathode 860 are stacked on a substrate 810 in this order. In addition, the general organic EL element 80 has a cathode contact region 870 formed of a conductive material, for example, in the same wiring layer as the anode 820. When a predetermined potential difference between the anode 820 and the cathode 860 is supplied, a predetermined potential difference is supplied to the B light emitting layer 830 and the Y light emitting layer 850 which are interposed between the anode 820 and the cathode 860, and thereby the B light emitting layer 830 and the Y light emitting layer 850 each emit light having a predetermined wavelength band with predetermined luminance. In description below, the B light emitting layer 830, the charge generation layer 840, and the Y light emitting layer 850 which are regions in which light emission is performed according to application of a voltage will also be collectively referred to as a light emitting unit 890. The organic EL element 80 is configured such that the light emitting unit 890 can emit white light as a whole when the B light emitting layer 830 and the Y light emitting layer 850 emit light at the same time.

Here, since the substrate 810, the anode 820, the pixel separation film 880, the B light emitting layer 830, the charge generation layer 840, the Y light emitting layer 850, the cathode 860, and the cathode contact region 870 may be constituent elements having the same functions as the substrate 110, the anode 120, the pixel separation film 180, the B light emitting layer 130, the charge generation layer 140, the Y light emitting layer 150, the cathode 160, and the cathode contact region 170 of the organic EL element 10 according to the first embodiment shown in FIG. 8, detailed description thereof will be omitted.

Also in the configuration shown in FIG. 10, the cathode contact region 870 is electrically connected to the cathode 860 as in the first embodiment, and thus has the same potential as the cathode 860. Specifically, an opening portion from which a surface of the cathode contact region 870 is exposed is provided in a position of the pixel separation film 880 in which the cathode contact region 870 is formed as shown in FIG. 10. Further, at least at the position corresponding to the opening portion, the B light emitting layer 830, the charge generation layer 840, and the Y light emitting layer 850 are not formed, and the cathode 860 is embedded in the opening portion so as to be in contact with the cathode contact region 870. Accordingly, the cathode 860 comes in contact with the cathode contact region 870. The cathode contact region 870 can function as, for example, an electrode for applying predetermined potential to the cathode 860.

In the general organic EL element 80 having the configuration exemplified in FIG. 10, such a contact structure of the cathode 860 and the cathode contact region 870 is provided in, for example, each pixel. Thus, since the cathode 860 may be formed to cover at least the light emission region and come in contact with the cathode contact region 870 in each pixel in the organic EL element 80, the organic EL element can be formed in a smaller area than the configuration of the organic EL element 70 shown in FIG. 9. Thus, low resistance of the cathode 860 can be attained and there is a possibility of more stable driving of the organic EL element 80. The organic EL element 80 shown in FIG. 10, however, like the organic EL element 70 shown in FIG. 9, is not provided with a potential control mechanism that controls potential of the charge generation layer 840. Thus, securing chromaticity of light emission by the B light emitting layer 830 and chromaticity of light emission by the Y light emitting layer 850 at a predetermined ratio over a wide range of light emission luminance levels of the light emitting unit 890 is considered to be difficult.

So far, the schematic configurations of the general stacking-type organic EL elements in which the B light emitting layers are arranged in the lower layer and the Y light emitting layers in the upper layer have been described with reference to FIGS. 9 and 10. As described above, since the organic EL elements 70 and 80 shown in FIGS. 9 and 10 are not provided with a potential control mechanism that controls potential of the charge generation layers 740 and 840, suppressing a change of a light emission color (for example, white) when light emission luminance of the light emitting units 790 and 890 is changed is considered to be difficult. On the other hand, the organic EL element 10 according to the first embodiment is provided with a charge generation layer contact structure in which the charge generation layer 140 and the cathode 160 are electrically connected to each other via a resistance having a predetermined resistance value as a potential control mechanism that controls potential of the charge generation layer 140 as described above. In addition, the charge generation layer contact structure can be realized more simply than, for example, in the configuration having sub pixels as in the aforementioned technology disclosed in JP 2012-194256A. Thus, due to the charge generation layer contact structure, potential of the charge generation layer 140 can be favorably controlled with a simpler configuration and a change of a light emission color (for example, white) when light emission luminance of the light emitting unit 190 is changed can be suppressed more in the first embodiment.

Further, in the organic EL element 10, the contact structure of the cathode 160 and the cathode contact region 170 may be provided in, for example, each pixel. Thus, the cathode 160 can be formed in a smaller area than in the configuration of the organic EL element 70 shown in FIG. 9, and low resistance of the cathode 160 can be attained. Therefore, a delay of a signal caused by the cathode 160 or the like can be prevented, and thus the organic EL element 10 can be stably driven.

Figure 11:
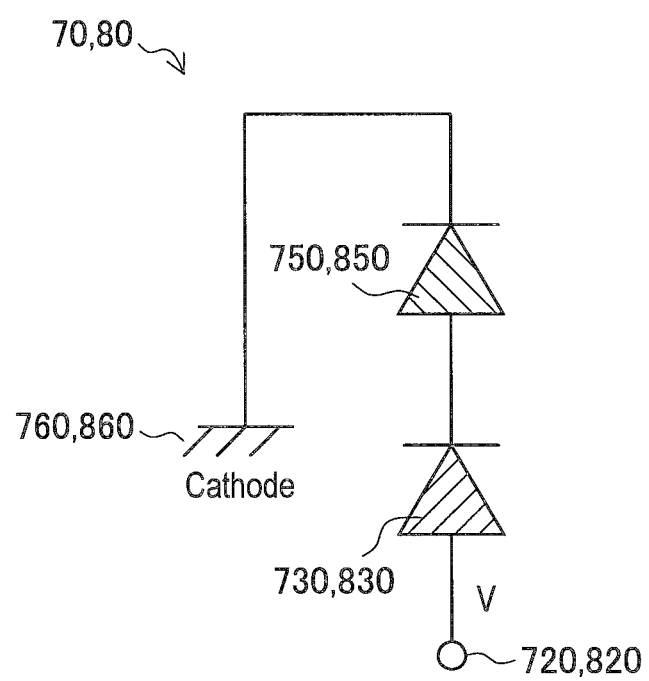
FIG. 11 is an illustrative diagram for describing a light emission characteristic of the general organic EL element.
Figure 12:
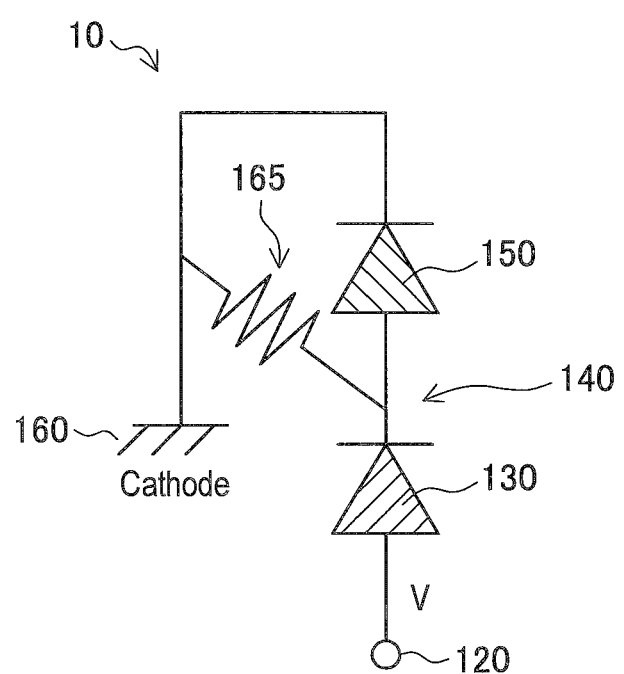
FIG. 12 is an illustrative diagram for describing a light emission characteristic of the organic EL element according to the first embodiment.

Herein, in order to describe the effect of suppressing a change in a light emission color of the organic EL element 10 according to the first embodiment, light emission characteristics of the general organic EL elements 70 and 80 and a light emission characteristic of the organic EL element 10 according to the first embodiment will be described with reference to FIGS. 11 and 12. FIG. 11 is an illustrative diagram for describing the light emission characteristic of the general organic EL elements 70 and 80. FIG. 12 is an illustrative diagram for describing the light emission characteristic of the organic EL element 10 according to the first embodiment. Note that, in FIGS. 11 and 12, the B light emitting layers 130, 730, and 830 and the Y light emitting layers 150, 750, and 850 are schematically denoted by the symbol of diodes.

First, a degree of chromaticity of light emission of the B light emitting layers 730 and 830 and the Y light emitting layers 750 and 850 when a current density is low, in other words, when luminance is low in the general organic EL elements 70 and 80 shown in FIG. 11, will be described. In the case of low luminance, a decrease rate of chromaticity of blue is greater than a decrease rate of chromaticity of yellow as shown in FIGS. 2 and 3. Thus, when a predetermined voltage V is applied between the cathodes 760 and 860 and the anodes 720 and 820, the B light emitting layers 730 and 830 and the Y light emitting layers 750 and 850 emit light as shown in FIG. 11; however, when luminance is low, the chromaticity of blue light emission of the B light emitting layers 730 and 830 becomes lower than the chromaticity of yellow light emission of the Y light emitting layers 750 and 850, and thus the organic EL elements 70 and 80 emit yellowish light as a whole.

Next, a degree of chromaticity of light emission of the B light emitting layers 730 and 830 and the Y light emitting layers 750 and 850 when a current density is high, in other words, when luminance is high in the general organic EL elements 70 and 80 shown in FIG. 11, will be described. In the case of high luminance, the difference between a change rate of chromaticity of blue and a change rate of chromaticity of yellow is smaller than in the case of low luminance as shown in FIGS. 2 and 3. Thus, when luminance is high, the chromaticity of blue light emission of the B light emitting layers 730 and 830 is substantially the same degree as the chromaticity of yellow light emission of the Y light emitting layers 750 and 850, and thus the organic EL elements 70 and 80 emit white light as a whole.

On the other hand, FIG. 12 shows a schematic configuration of the stacking structure of the organic EL element 10 according to the first embodiment. First, a degree of chromaticity of light emission of the B light emitting layer 130 and the Y light emitting layer 150 when a current density is low, in other words, when luminance is low in the organic EL element 10 according to the first embodiment shown in FIG. 12, will be described. Referring to FIG. 12, also in the organic EL element 10, when a predetermined voltage V is applied between the cathode 160 and the anode 120, the B light emitting layer 130 and the Y light emitting layer 150 emit light, as in the general organic EL elements 70 and 80. In the organic EL element 10, however, the charge generation layer 140 and the cathode 160 are electrically connected to each other via a resistance 165 having a predetermined resistance value as shown in FIG. 12. Since the organic EL element 10 has a leak path formed between the charge generation layer 140 and the cathode 160 having the resistance 165 thereon as described above, when the same potential difference V is supplied between the cathode 160 and the anode 120, a potential difference supplied to the Y light emitting layer 150 stacked in the upper stage decreases more than in the general organic EL elements 70 and 80. Thus, the chromaticity of yellow light emission of the Y light emitting layer 150 decreases more than in the general organic EL elements 70 and 80. In this manner, since the chromaticity of the yellow light emission of the Y light emitting layer 150 is suppressed when luminance is low in the organic EL element 10, the organic EL element 10 emits white light as a whole.

Next, a degree of chromaticity of light emission of the B light emitting layer 130 and the Y light emitting layer 150 when a current density is high, in other words, luminance is high in the organic EL element 10 according to the first embodiment shown in FIG. 12, will be described. When the current density is high, the value of the potential difference V supplied between the cathode 160 and the anode 120 is greater than when the current density is low. Thus, even though the leak path is formed between the charge generation layer 140 and the cathode 160 having the resistance 165 thereon, a voltage value sufficient for realizing yellow light emission with desired chromaticity can be applied to the Y light emitting layer 150 stacked in the upper stage. Accordingly, in the organic EL element 10, the chromaticity of blue light emission of the B light emitting layer 130 and the chromaticity of yellow light emission of the Y light emitting layer 150 are substantially the same degree when luminance is high, and thus the organic EL element 10 emits white light as a whole.

The light emission characteristic of the general organic EL elements 70 and 80 and the light emission characteristic of the organic EL element 10 according to the first embodiment have been described above with reference to FIGS. 11 and 12. As described above, since a potential control mechanism that controls potential of the charge generation layers 740 and 840 is not provided in the organic EL elements 70 and 80, there is a possibility of white that is a light emission color of the whole organic EL elements 70 and 80 changing, particularly in low luminance. On the other hand, the organic EL element 10 according to the first embodiment has the charge generation layer contact structure in which the charge generation layer 140 and the cathode 160 are electrically connected to each other via the resistance 165 having a predetermined resistance value as a potential control mechanism that controls potential of the charge generation layer 140. In addition, the charge generation layer contact structure can be realized more simply than in, for example, the configuration having sub pixels as in the aforementioned technology disclosed in JP 2012-194256A. Thus, due to the charge generation layer contact structure in the first embodiment, potential of the charge generation layer 140 can be favorably controlled with the simpler configuration, and a change in white that is a light emission color can be controlled over a wider range of light emission luminance levels of the organic EL element 10.

[2-3. Manufacturing Method of an Organic EL Element]

Figure 13A:
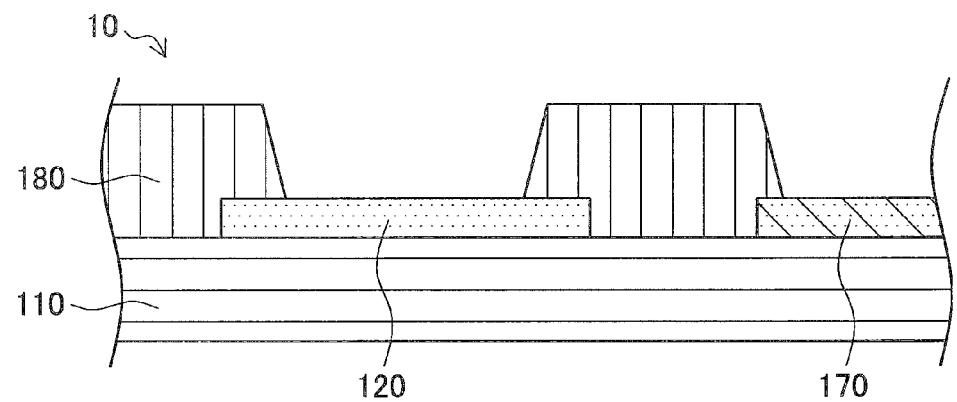
FIG. 13A is a cross-sectional diagram showing an example of a manufacturing method of the organic EL element according to the first embodiment.
Figure 13B:
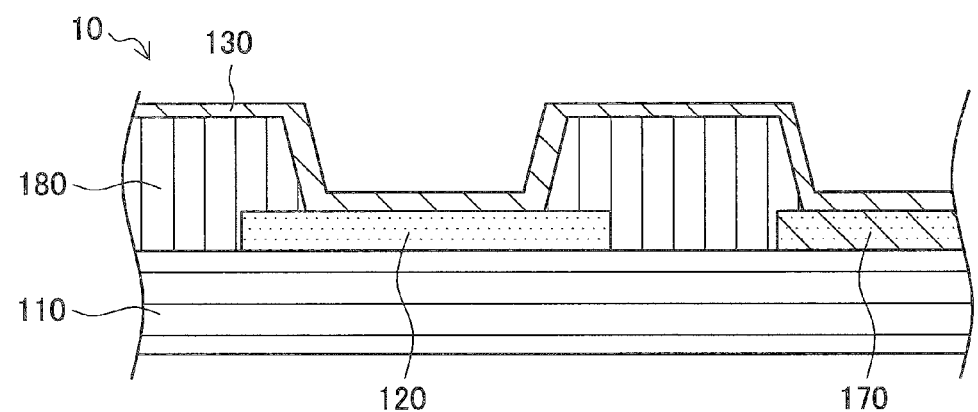
FIG. 13B is a cross-sectional diagram showing an example of a manufacturing method of the organic EL element according to the first embodiment.
Figure 13C:
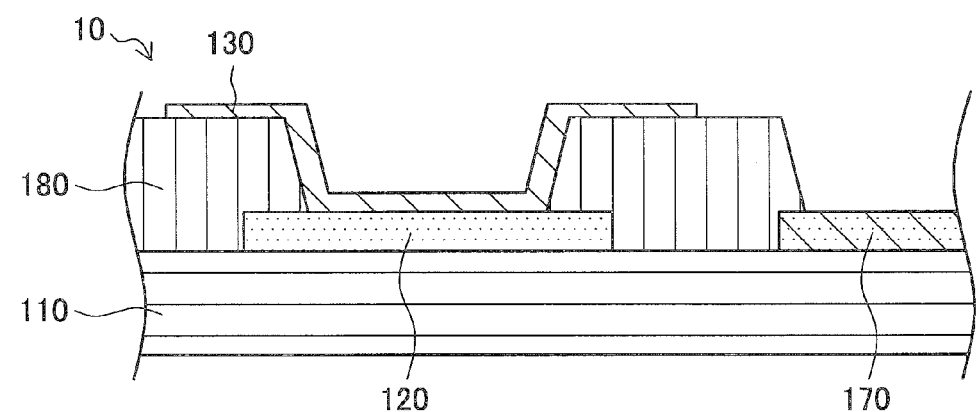
FIG. 13C is a cross-sectional diagram showing an example of a manufacturing method of the organic EL element according to the first embodiment.

Next, an example of a manufacturing method of the organic EL element 10 having the configuration exemplified in FIG. 8 will be described with reference to FIGS. 13A to 13C. FIGS. 13A to 13C are cross-sectional diagrams showing the example of the manufacturing method of the organic EL element 10 according to the first embodiment. FIGS. 13A to 13C schematically illustrate cross-sections of the organic EL element 10 in order of steps of the manufacturing method of the organic EL element 10, indicating the process flow of the manufacturing method.

In the manufacturing method of the organic EL element 10 according to the first embodiment, first, a wiring pattern that functions as the anode 120 and the cathode contact region 170 is processed on the substrate 110, then the pixel separation film 180 is stacked thereon, and then opening portions are provided in positions of the pixel separation film 180 corresponding to the anode 120 and the cathode contact region 170 as shown in FIG. 13A. The anode 120 and the cathode contact region 170 can be formed such that a conductive material is stacked on the substrate 110 to have a predetermined thickness using a method such as a sputtering method, a vapor deposition method, or the like, and then the conductive material is selectively removed using anisotropic etching such as a dry etching method. In addition, the pixel separation film 180 can be formed such that, for example, an insulating material is stacked on the anode 120 and the cathode contact region 170 to have a predetermined thickness using a method such as the vapor deposition method, and then the opening portions are provided in predetermined positions using anisotropic etching such as the dry etching method. The opening portions are formed to have a depth sufficient for exposing surfaces of the anode 120 and the cathode contact region 170.

Note that, as a method for providing the opening portions in the pixel separation film 180 and a method of making electric connection between a constituent member of the upper layer and a constituent member of the lower layer via the opening portions, for example, a method using a vapor deposition mask, a method using radiation of laser light disclosed in JP 2007-52966A and a method using a reverse tapered shape disclosed in JP 2013-54979A which are preceding applications filed by the same applicant as the present applicant, and the like can be applied.

Next, as shown in FIG. 13B, the B light emitting layer 130 is stacked on the entire surface of the anode 120, the cathode contact region 170, and the pixel separation film 180. The B light emitting layer 130 is embedded in the opening portions provided in the pixel separation film 180, and stacked so as to be at least in contact with the anode 120 through the opening portion. In order to more reliably secure the contact of the B light emitting layer 130 and the anode 120, the B light emitting layer 130 is preferably stacked using a method that is excellent in an embedability (coverage) in an opening portion Next, as shown in FIG. 13C, the region of the stacked B light emitting layer 130 which corresponds to the opening portion of the pixel separation film 180 provided on the cathode contact region 170 is removed. Here, the removal of the B light emitting layer 130 may be performed such that at least the region corresponding to the light emission region remains and the surface of the cathode contact region 170 is exposed, and a specific region of the B light emitting layer 130 to be removed is not limited to the example shown in FIG. 13C.

Next, the charge generation layer 140 is stacked over the entire surface of the configuration shown in FIG. 13C. Accordingly, the anode 120, the B light emitting layer 130, and the charge generation layer 140 which are the region corresponding to the light emission region are stacked in this order. On the other hand, in the region corresponding to the cathode contact region 170, the charge generation layer 140 is directly stacked on the cathode contact region 170, and they are electrically connected to each other. In order to secure the contact of the charge generation layer 140 and the cathode contact region 170 more reliably, the charge generation layer 140 is preferably stacked using a method with satisfactory coverage of the opening portion. In addition, for stacking of the charge generation layer 140, a method and a condition taking a contact resistance between the charge generation layer 140 and the cathode contact region 170 into account may be used. When an increase in the contact resistance between the charge generation layer 140 and the cathode contact region 170 is desired, for example, a method and a condition that relatively increase surface roughness of the contact face of the charge generation layer 140 with the cathode contact region 170 may be selected. Conversely, when a decrease in a resistance value between the charge generation layer 140 and the cathode contact region 170 is desired, a method and a condition that relatively decrease surface roughness of the contact face of the charge generation layer 140 with the cathode contact region 170 may be selected. A material and a stacking method of the charge generation layer 140 may be appropriately designed so as to realize a desired resistance value between the charge generation layer 140 and the cathode contact region 170

After the charge generation layer 140 is stacked, the Y light emitting layer 150 and the cathode 160 are sequentially stacked, and thereby the configuration of the organic EL element 10 shown in FIG. 8 is realized. Note that, when the organic EL element 10 has other layers that are not illustrated in FIG. 8 (for example, a hole injection layer, a hole transport layer, an electron injection layer, an electron transport layer, and the like), steps of forming the layers may be added in an appropriate stage. In addition, as methods of forming the layers, various known methods used in the manufacturing process of a general organic EL element may be applied.

3. Second Embodiment

The first embodiment described above has the charge generation layer contact structure in which the charge generation layer 140 and the cathode 160 are electrically connected to each other via the resistance having a predetermined resistance value as a potential control mechanism that controls potential of the charge generation layer 140. The present disclosure, however, is not limited thereto. Hereinbelow, an organic EL element with a potential control mechanism that has a different configuration from that of the first embodiment will be described as a second embodiment of the present disclosure.

[3-1. Examination of a General Organic EL Element]

In order to additionally clarify the second embodiment of the present disclosure, first, a result of another examination that the present inventors have performed on a general organic EL element will be described, in addition to the result of the examination described in <1. Examination of a general organic EL element> above.

As described in <1. Examination of a general organic EL element> above, it is difficult for the light emitting unit 69 of the general organic EL element 60 having the configuration shown in FIG. 1 to maintain white over a wide range of light emission luminance levels. This is because balance between the chromaticity of yellow light emission by the Y light emitting layer 61 and the chromaticity of blue light emission by the B light emitting layer 63 is broken when light emission luminance changes since dependency of the chromaticity of yellow light emission by the Y light emitting layer 61 on light emission luminance and dependency of the chromaticity of blue light emission by the B light emitting layer 63 on light emission luminance have different traits as shown in FIGS. 2 and 3.

Figure 14:
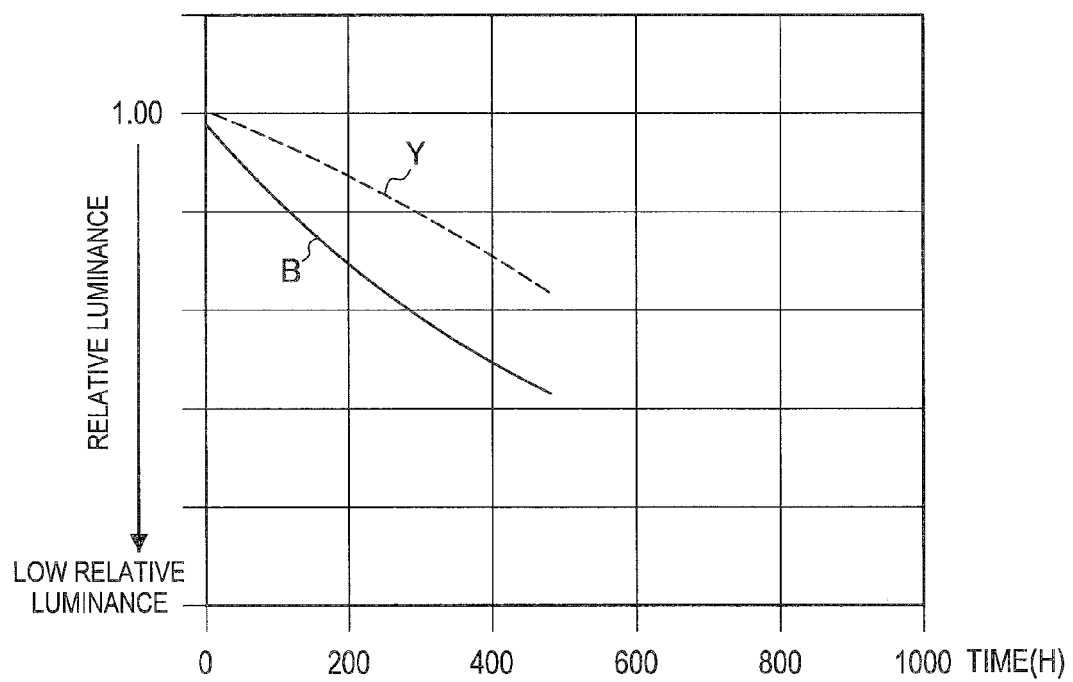
FIG. 14 is a graph showing dependency of light emission luminance of a Y light emitting layer and a B light emitting layer used in the general organic light emitting element on use time.

Here, a light emission characteristic of the Y light emitting layer 61 and the B light emitting layer 63 such as the dependency of the chromaticity of light emission on light emission luminance is considered to be derived mainly from the materials of the Y light emitting layer 61 and the B light emitting layer 63. The light emission characteristic of the Y light emitting layer 61 and the B light emitting layer 63, however, is known to also change according to a use environment such as a use time and a use temperature. As an example of a change in the light emission characteristic according to such a use environment, a change in the light emission characteristic of the Y light emitting layer 61 and the B light emitting layer 63 according to a use time will be described with reference to FIG. 14. FIG. 14 is a graph showing dependency of light emission luminance of the Y light emitting layer 61 and B light emitting layer 63 used in the general organic EL element 60 on use time.

In FIG. 14, the horizontal axis represents use time of the Y light emitting layer 61 and B light emitting layer 63 of the general organic EL element 60 (in other words, time for which the Y light emitting layer 61 and B light emitting layer 63 are driven), the vertical axis represents a value of light emission luminance of the Y light emitting layer 61 and B light emitting layer 63 when a constant voltage is applied, and thereby a relation therebetween is plotted. Note that the vertical axis shows relative luminance of 1.00 that is the value of light emission luminance when the use time is zero. In FIG. 14, light emission luminance of the Y light emitting layer 61 is indicated by a dashed-lined curve Y, and light emission luminance of the B light emitting layer 63 is indicated by a solid curve B.

Referring to FIG. 14, it is found that, as the use time increases, light emission luminance of the Y light emitting layer 61 and B light emitting layer 63 decreases (deteriorates). Here, if the characteristics of deterioration in the light emission luminance of the Y light emitting layer 61 and B light emitting layer 63 are similar to each other, the light emission luminance of the Y light emitting layer 61 and B light emitting layer 63 deteriorates to the same extent due to use of the organic EL element 60, and thus balance of chromaticity between both is not considered to be lost. In reality, however, the characteristic of deterioration in the light emission luminance of the Y light emitting layer 61 is different from that of the B light emitting layer 63 as shown in FIG. 14. It can be said that the characteristic shown in FIG. 14 indicates that there is a possibility in the general organic EL element 60 of a change in the color of white light when the element is used for a long period of time even in relatively high luminance.

Here, since the Y light emitting layer 61 and B light emitting layer 63 are layers formed of different materials, it is difficult to make the characteristics of deterioration in light emission luminance of both the same. In addition, as a factor that accelerates the deterioration in the light emission luminance of the Y light emitting layer 61 and B light emitting layer 63 (a deterioration acceleration coefficient), there are parameters such as a current applied during use, temperature, and humidity; however, use forms of the organic EL element 60 vary in, for example, an illuminating device, a display device, and the like, and thus the parameters can also be variously changed. Therefore, accurately predicting deterioration in the light emission luminance of the Y light emitting layer 61 and B light emitting layer 63 beforehand is difficult. As described above, it is difficult in the general organic EL element 60 to suppress a change in the color of white light caused by a change in the light emission luminance of the Y light emitting layer 61 and B light emitting layer 63 according to a use environment such as a use time or a use temperature.

Hereinabove, the result of the other examination that the present inventors performed on the general organic EL element 60 has been described with reference to FIG. 14. The present inventors seriously examined a configuration for further suppressing a change in the color of light emission of an organic EL element based on the above examination results, and as a result, have attained the organic EL element according to the second embodiment of the present disclosure as below. Hereinbelow, the second embodiment that is another preferred embodiment of the present disclosure will be described in detail.

[3-2. Structure of an Organic EL Element]

Figure 15:
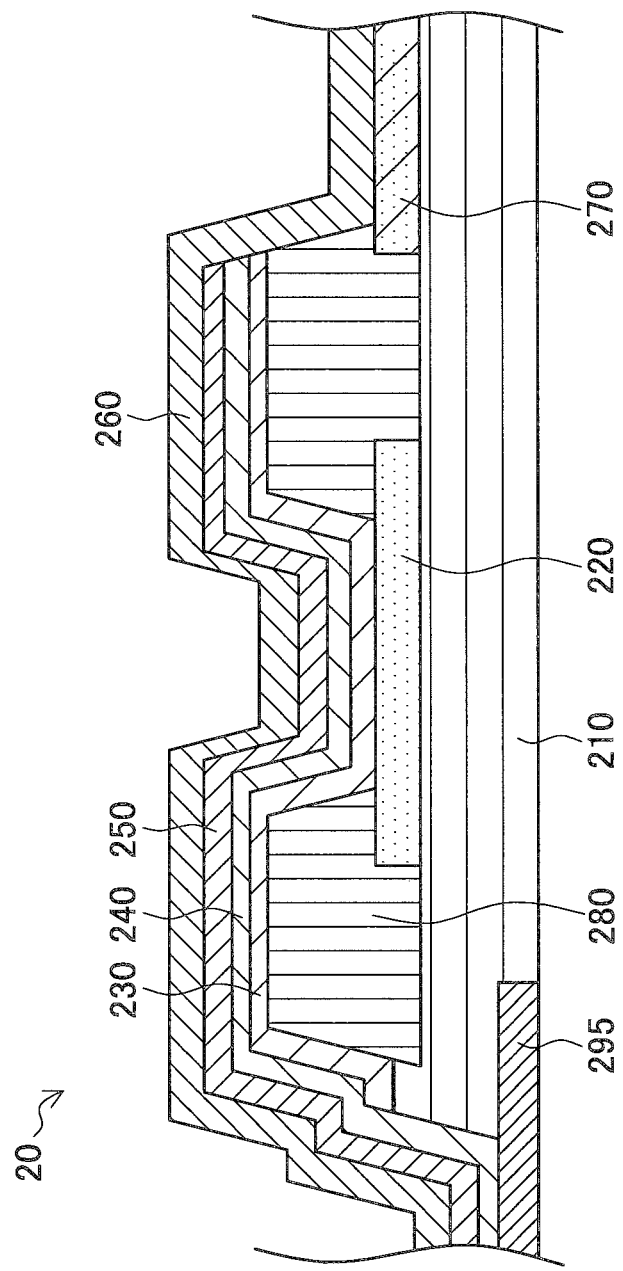
FIG. 15 is a cross-sectional diagram showing a schematic configuration of a stacking structure of an organic EL element according to a second embodiment of the present disclosure.

A configuration example of the organic EL element according to the second embodiment of the present disclosure will be described with reference to FIG. 15. FIG. 15 is a cross-sectional diagram showing a schematic configuration of a stacking structure of the organic EL element according to the second embodiment of the present disclosure.

Referring to FIG. 15, the organic EL element 20 according to the second embodiment is formed such that an anode 220, a pixel separation film 280, a blue light emitting layer 230 (B light emitting layer 230) that is an organic light emitting layer containing an organic compound and emitting blue light when a predetermined potential difference is supplied, a charge generation layer 240, a yellow light emitting layer 250 (Y light emitting layer 250) that is an organic light emitting layer containing an organic compound and emitting yellow light when a predetermined potential difference is supplied, and a cathode 260 are stacked on a substrate 210 in this order. In addition, the organic EL element 20 has a cathode contact region 270 that is formed of a conductive material, for example, in the same wiring layer as the anode 220. Further, the organic EL element 20 has a charge generation layer electrode 295 that is formed of a conductive material, for example, in a different wiring layer from the anode 220.

When a predetermined potential difference is supplied between the anode 220 and the cathode 260, a predetermined potential difference is supplied to the B light emitting layer 230 and the Y light emitting layer 250 which are interposed between the anode 220 and the cathode 260, and thereby the B light emitting layer 230 and the Y light emitting layer 250 each emit light having predetermined wavelength bands with predetermined luminance. In description below, the B light emitting layer 230, the charge generation layer 240, and the Y light emitting layer 250 which are regions in which light emission is performed when a potential difference is supplied will also be collectively referred to as a light emitting unit 290. When organic EL element 20 is configured such that the light emitting unit 290 can emit white light as a whole when the B light emitting layer 230 and the Y light emitting layer 250 emit light at the same time. The organic EL element 20, however, may be configured such that the light emitting unit 290 can emit light having a predetermined wavelength band as a whole when the B light emitting layer 230 and the Y light emitting layer 250 emit light at the same time, and the light emission color may be one other than white.

Note that FIG. 15 illustrates the configuration in which one organic EL element 20 is formed on the substrate 210 for simplification; however, in reality, a plurality of organic EL elements 20 can be arrayed on the substrate 210 according to an application. Further, a region that includes the plurality of arrayed organic EL elements 20 can be compartmentalized to a plurality of regions each including at least one organic EL element 20 and each compartmentalized region can function as a pixel.

Here, since the substrate 210, the anode 220, the pixel separation film 280, the B light emitting layer 230, the charge generation layer 240, the Y light emitting layer 250, and the cathode 260 may be constituent members having the same functions as the substrate 110, the anode 120, the pixel separation film 180, the B light emitting layer 130, the charge generation layer 140, the Y light emitting layer 150, and the cathode 160 of the organic EL element 10 according to the first embodiment shown in FIG. 8, detailed description thereof will be omitted.

The cathode contact region 270 is electrically connected to the cathode 260, and has the same potential as the cathode 260. Specifically, the cathode contact region 270 may have the same configuration as the cathode contact region 870 of the organic EL element 80 shown in FIG. 10. In the position of the pixel separation film 280 in which the cathode contact region 270 is formed, for example, an opening portion is provided such that a surface of the cathode contact region 270 is exposed therethrough as shown in FIG. 15. In addition, in the position at least corresponding to the opening portion, the B light emitting layer 230, the charge generation layer 240, and the Y light emitting layer 250 are not formed, and the cathode 260 is embedded in the opening portion so as to come in contact with the cathode contact region 270. Accordingly, the cathode 260 and the cathode contact region 270 come in contact with each other in the opening portion, and thus are electrically connected to each other. The cathode contact region 270 can function as, for example, an electrode for supplying a predetermined potential to the cathode 260.

In the organic EL element 20 according to the second embodiment, such a contact structure of the cathode 260 and the cathode contact region 270 is provided in, for example, each pixel. Hence, the cathode 260 may be formed in each pixel so as to cover at least the light emission region and to be in contact with the cathode contact region 270, and thus the organic EL element 20 can be formed in a smaller area than, for example, the general organic EL element 70 shown in FIG. 9. Therefore, low resistance of the cathode 260 can be attained, and the organic EL element 20 can be driven more stably.

The charge generation layer electrode 295 is formed such that a conductive material is processed to have a predetermined pattern in, for example, a different wiring layer from the anode 220. In the example shown in FIG. 15, the charge generation layer electrode 295 is formed in a back surface of the substrate 210 (a surface in which the organic EL element 20 is not formed). The charge generation layer electrode 295 may be composed of, for example, the same material as the anode 220 (in other words, the same material as the anode 120 according to the above-described first embodiment). In the second embodiment, the charge generation layer electrode 295 is electrically connected to a power supply circuit (not illustrated), and predetermined potential is supplied to the charge generation layer electrode 295 by the power supply circuit. The potential supplied to the charge generation layer electrode 295 can be dynamically changed during driving of the organic EL element 20 by the power supply circuit. Note that the power supply circuit may be configured to have the above-described function, and any of various know circuit configurations may be applied thereto, and thus detailed description thereof will be omitted. In addition, the power supply circuit may be formed along with the organic EL element 20 on the substrate on which the organic EL element 20 is formed, and may be provided in devices, modules, electronic apparatuses, and the like in which the organic EL element 20 is mounted as a separate member from the organic EL element 20.

In the second embodiment, the organic EL element 20 is configured such that the charge generation layer electrode 295 and the charge generation layer 240 are electrically connected to each other. To be specific, in a position of the pixel separation film 280 and the substrate 210 in which the charge generation layer electrode 295 is formed, an opening portion is provided so that a surface of the charge generation layer electrode 295 is exposed therethrough as shown in FIG. 15. In addition, in the position at least corresponding to the opening portion, the B light emitting layer 230 is not formed, and the charge generation layer 240 is embedded in the opening portion so that the charge generation layer comes in contact with the charge generation layer electrode 295. Accordingly, the charge generation layer 240 and the charge generation layer electrode 295 are electrically connected to each other in the opening portion. As described above, the charge generation layer electrode 295 is configured to be connected to the power supply circuit and to have controllable potential, and thus in the second embodiment, potential of the charge generation layer 240 is controlled when predetermined potential is supplied to the charge generation layer electrode 295 by the power supply circuit. By appropriately controlling the potential of the charge generation layer 240, potential of the B light emitting layer 230 and the Y light emitting layer 250 can be adjusted independently, and thus the light emitting unit 290 can be driven so that a change in a light emission color of the light emitting unit 290 is reduced.

Figure 16:
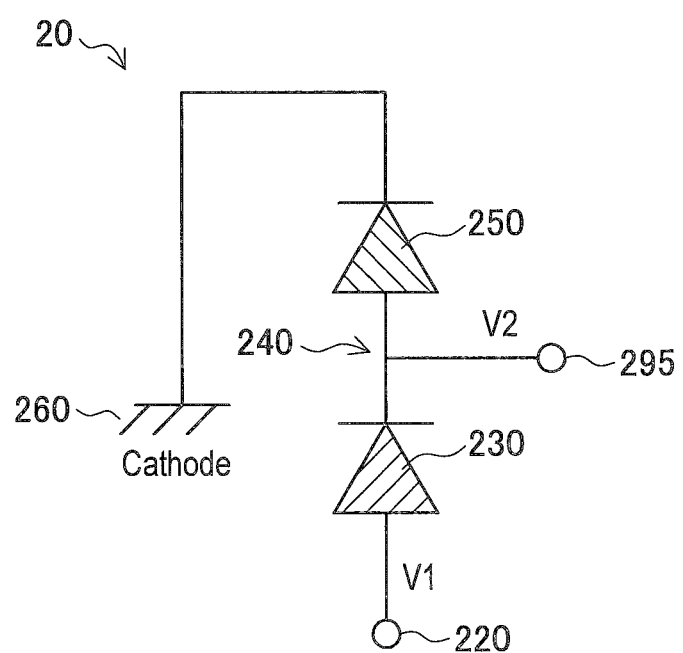
FIG. 16 is an illustrative diagram for describing a driving method of the organic EL element according to the second embodiment.

Herein, a driving method of the organic EL element 20 according to the second embodiment will be described with reference to FIG. 16. FIG. 16 is an illustrative diagram for describing the driving method of the organic EL element 20 according to the second embodiment. Note that FIG. 16 is a diagram corresponding to FIGS. 11 and 12 described above, in which the B light emitting layer 230 and the Y light emitting layer 250 are schematically denoted as by the symbol of diodes.

Referring to FIG. 16, when the organic EL element 20 is driven, a predetermined potential difference V1 is supplied between the cathode 260 and the anode 220. Accordingly, a predetermined potential difference is supplied also to the B light emitting layer 230 and the Y light emitting layer 250, and then the B light emitting layer 230 and the Y light emitting layer 250 emit light with predetermined luminance. Here, in the second embodiment, the organic EL element 20 has the charge generation layer electrode 295 that is electrically connected to the charge generation layer 240 as a potential control mechanism for controlling potential of the charge generation layer 240 as described above. Specifically, the charge generation layer 240 is electrically connected to the charge generation layer electrode 295 that is connected to the power supply circuit in the organic EL element 20 as shown in FIG. 15, and accordingly, potential of the charge generation layer 240 is configured to be controlled by the power supply circuit via the charge generation layer electrode 295. Thus, for example, a predetermined potential V2 can be supplied to the charge generation layer 240 by the power supply circuit via the charge generation layer electrode 295 as shown in FIG. 16.

Controlling the potential of the charge generation layer 240 that is the middle layer between the B light emitting layer 230 and the Y light emitting layer 250 means controlling the potential difference supplied to the B light emitting layer 230 and the Y light emitting layer 250. In the second embodiment, the potential V2 supplied to the charge generation layer 240 can be controlled such that a change in chromaticity of light emission of the whole organic EL element 20 is suppressed when a use environment of the organic EL element 20 is changed.

Here, a control circuit for controlling driving of the power supply circuit connected to the charge generation layer electrode 295, for example, can be provided in the second embodiment. The control circuit may be, for example, a processor such as a central processing unit (CPU), and may be formed along with the organic EL element 20 on the substrate on which the organic EL element 20 is formed, and may be provided in devices, modules, electronic apparatuses, and the like in which the organic EL element 20 is mounted as a separate member from the organic EL element 20. The control circuit can drive the power supply circuit so that the change amount of the ratios of respective light emission luminance of the B light emitting layer 230 and the Y light emitting layer 250 according to the use environment is compensated and control the potential V2 supplied to the charge generation layer electrode 295. Here, a change in the ratios of respective light emission luminance of the B light emitting layer 230 and the Y light emitting layer 250 according to the use environment includes, for example, a change in the light emission luminance of the whole organic EL element 20 and in the ratios of the light emission luminance according to a use time, and a use temperature of the organic EL element 20.

When the light emission luminance of the whole organic EL element 20 (a current density or a potential difference supplied to the whole organic EL element 20) is changed as described with reference to FIGS. 2 to 4, for example, the ratio between light emission luminance of the B light emitting layer 230 and light emission luminance of the Y light emitting layer 250 changes due to the fact that the light emission luminance of the B light emitting layer 230 and the light emission luminance of the Y light emitting layer 250 change showing different characteristics, and thus the chromaticity of light emission of the whole organic EL element 20 changes. Thus, in the second embodiment, as the control circuit appropriately controls the potential V2 supplied to the charge generation layer electrode 295 when, for example, the light emission luminance of the whole organic EL element 20 is changed, the light emission luminance of the B light emitting layer 230 and the light emission luminance of the Y light emitting layer 250 are adjusted so that the change in the ratios between the light emission luminance of the B light emitting layer 230 and the light emission luminance of the Y light emitting layer 250 is reduced, and thereby a change in chromaticity of light emission of the whole organic EL element 20 is suppressed.

In addition, for example, the potential V2 supplied to the charge generation layer electrode 295 may be controlled such that dependency of the light emission luminance of the B light emitting layer 230 and the Y light emitting layer 250 on a use environment is acquired in advance in a form of a table, a graph, or the like and the control circuit refers to the table, the graph, or the like. Specifically, the potential V2 supplied to the charge generation layer electrode 295 may be controlled such that dependency of the light emission luminance of the B light emitting layer 230 and the Y light emitting layer 250 on a use time is acquired in advance and the control circuit refers to a table, a graph, or the like indicating the use time dependency. In addition, the dependency of the light emission luminance of the B light emitting layer 230 and the Y light emitting layer 250 on a use temperature may be acquired in advance and a temperature sensor that measures a use temperature of the organic EL element 20 may be further provided, and the control circuit may control the potential V2 supplied to the charge generation layer electrode 295 referring to the table, the graph, or the like indicating the use temperature dependency and the temperature of the organic EL element 20 measured by the temperature sensor. Further, in a more direct manner, a luminance sensor that measures light emission luminance of the organic EL element 20 may be further provided and the control circuit may control the potential V2 supplied to the charge generation layer electrode 295 referring to the light emission luminance of the organic EL element 20 measured by the luminance sensor.

By applying the potential to the charge generation layer electrode 295 so that the change amount of the ratios of respective light emission luminance of the B light emitting layer 230 and the Y light emitting layer 250 is compensated for, a change in chromaticity of blue light emission of the B light emitting layer 230 and chromaticity of yellow light emission of the Y light emitting layer 250 is suppressed, and a change in the color of light emission of the whole light emitting unit 290 is also suppressed. In this manner, by appropriately controlling the potential V2 supplied to the charge generation layer 240 in the second embodiment, a change in chromaticity of light emission of the whole organic EL element 20 attributable to various causes can be suppressed.

In addition, although the case in which the potential V2 applied to the charge generation layer electrode 295 is controlled according to a use environment has been described above, the second embodiment is not limited thereto. For example, at the same time as the potential V2 applied to the charge generation layer electrode 295, the potential difference V1 between the cathode 260 and the anode 220 may be controlled so that the change amount of the ratios of light emission luminance of the B light emitting layer 230 and the Y light emitting layer 250 according to a use environment is compensated for. By controlling the potential difference V1 between the cathode 260 and the anode 220 and the potential V2 applied to the charge generation layer electrode 295 simultaneously, potential of the B light emitting layer 230 and the Y light emitting layer 250 can be controlled with higher accuracy, and thus a change in chromaticity of light emission of the whole organic EL element 20 can be further suppressed.

So far, the configuration example and the overview of the driving method of the organic EL element 20 according to the second embodiment of the present disclosure have been described with reference to FIGS. 15 and 16. Note that, although the charge generation layer electrode 295 is formed in the back surface of the substrate 210 in the example shown in FIG. 15, the second embodiment is not limited thereto. The charge generation layer electrode 295 may be electrically connected to the charge generation layer 240, and a position in which the charge generation layer electrode 295 is formed may be arbitrary. The charge generation layer electrode 295 may be formed in, for example, the same wiring layer as the anode 220. In addition, the configuration illustrated in FIG. 15 is one configuration example of the organic EL element 20 according to the second embodiment, and the organic EL element 20 may have another configuration. For example, the organic EL element 20 may be further provided with various known layers that are used in a general organic EL element such as a hole injection layer, a hole transport layer, an electron injection layer, and an electron transport layer, in addition to the layers shown in FIG. 15. Presence and absence of the layers and addition positions of the layers may be appropriately set according to applications of the organic EL element 20, the configuration and the function of the light emitting unit 290, and the like.

As described in [3-1. Examination of a general organic EL element] above herein, the light emission characteristic (for example, dependency of chromaticity of light emission on a current density) of the Y light emitting layer 61 and the B light emitting layer 63 of the general organic EL element 60 can be changed due to a range of light emission luminance to be used, and due to a use time. In addition, the light emission characteristic of the Y light emitting layer 61 and the B light emitting layer 63 can be changed due to other factors such as manufacturing irregularity or the like in a manufacturing process of the organic EL element 60. In this manner, since the light emission characteristic of the Y light emitting layer 61 and the B light emitting layer 63 can be independently changed due to various factors, it is difficult to control both of the chromaticity of yellow light emission from the Y light emitting layer 61 and the chromaticity of blue light emission from the B light emitting layer 63 with high accuracy, and to control a change in the chromaticity of light emission of the whole organic EL element 60.

On the other hand, by controlling the potential V2 of the charge generation layer 240 of the organic EL element 20 according to the second embodiment, the potential difference supplied to the B light emitting layer 230 and the Y light emitting layer 250 can be controlled. In addition, the potential V2 of the charge generation layer 240 may be dynamically adjusted according to a use environment of the organic EL element 20. Thus, adjustment of the chromaticity of light emission of the Y light emitting layer 250 and the B light emitting layer 230 with higher accuracy taking the range of light emission luminance in which the organic EL element 20 is used as described above, a use time of the organic EL element 20, unevenness in manufacturing of the organic EL element 20, and the like into account is possible. Accordingly, a change in a light emission color of the organic EL element 20 caused by various factors can be suppressed. In addition, since the potential V2 of the charge generation layer 240 can be appropriately controlled in the organic EL element 20 according to the second embodiment, it is also possible to change chromaticity of light emission intentionally if necessary.

In addition, in the second embodiment, the potential control mechanism is realized by forming the charge generation layer electrode 295, and causing the charge generation layer electrode 295 to be electrically connected to the charge generation layer 240. Since the formation of the charge generation layer electrode 295 and the connection of the charge generation layer 240 to the charge generation layer electrode 295 can be processed through a manufacturing process used in manufacturing of a general organic EL element, a rise in manufacturing costs can be suppressed. Particularly, when the charge generation layer electrode 295 is formed within the same wiring layer as the anode 220, the charge generation layer electrode 295 and the anode 220 can be formed in the same step, and thus further reduction of the manufacturing costs can be attained. As above, even when the provision of the power supply circuit for applying predetermined potential to the charge generation layer electrode 295 and the control circuit that controls driving of the power supply circuit is considered, a change in chromaticity of light emission can be suppressed with a simpler configuration in the second embodiment than in, for example, the method for correcting chromaticity using sub pixels as disclosed in JP 2012-194256A described above.

[3-3. Manufacturing Method of the organic EL Element]

Figure 17A:
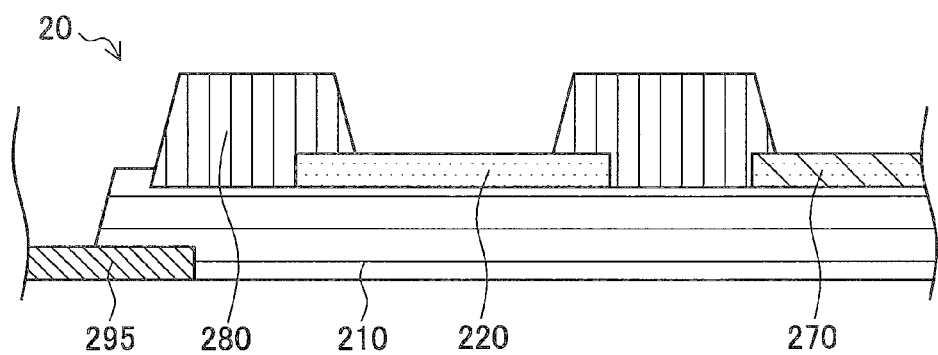
FIG. 17A is a cross-sectional diagram showing an example of a manufacturing method of the organic EL element according to the second embodiment of the present disclosure.
Figure 17B:
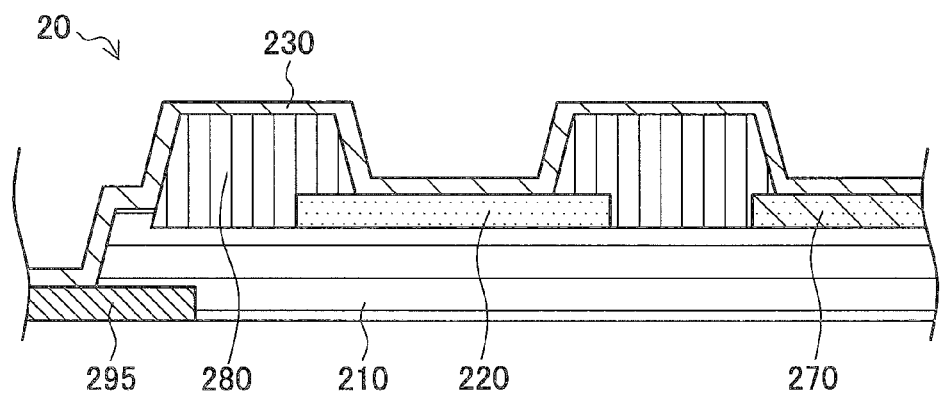
FIG. 17B is a cross-sectional diagram showing an example of a manufacturing method of the organic EL element according to the second embodiment of the present disclosure.
Figure 17C:
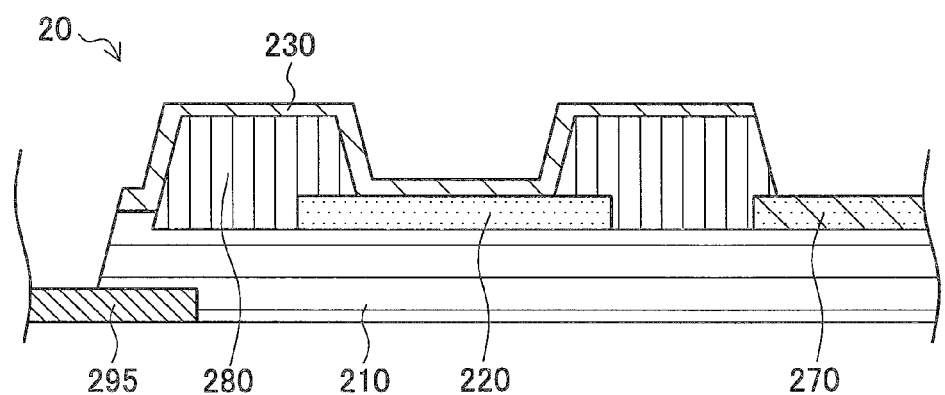
FIG. 17C is a cross-sectional diagram showing an example of a manufacturing method of the organic EL element according to the second embodiment of the present disclosure.

Next, an example of a manufacturing method of the organic EL element 20 exemplified in FIG. 15 will be described with reference to FIGS. 17A to 17C. FIGS. 17A to 17C are cross-sectional diagrams showing the example of the manufacturing method of the organic EL element 20 according to the second embodiment of the present disclosure. FIGS. 17A to 17C schematically illustrate a cross-section of the organic EL element 20 in order of steps of the manufacturing method of the organic EL element 20, showing the process flow of the manufacturing method.

In the manufacturing method of the organic EL element 20 according to the second embodiment, a wiring pattern that will function as the anode 220 and the cathode contact region 270 is first processed on the substrate 210, then the pixel separation film 280 is stacked thereon, and opening portions are provided in the positions of the pixel separation film 280 corresponding to the anode 220 and the cathode contact region 270 as shown in FIG. 17A. In addition, a wiring pattern that will function as the charge generation layer electrode 295 is processed on the back surface of the substrate 210 (the surface on which the anode 220 and the cathode contact region 270 are not formed), an opening portion is provided in the position of the substrate 210 and the pixel separation film 280 corresponding to the charge generation layer electrode 295 is provided.

The anode 220, the cathode contact region 270, and the charge generation layer electrode 295 can be formed such that, for example, a conductive material is stacked on the substrate 210 to have a predetermined thickness using a method such as a sputtering method or a vapor deposition method, and then the conductive material is selectively removed using anisotropic etching such as the dry etching method. In addition, the pixel separation film 280 can be formed such that, for example, an insulating material is stacked on the anode 220 and the cathode contact region 270 to have a predetermined thickness using a method such as the vapor deposition method, and then the opening portions are provided in the predetermined positions using anisotropic etching such as the dry etching method. The opening portions are provided to have depths sufficient for exposing surfaces of the anode 220, the cathode contact region 270, and the charge generation layer electrode 295 therefrom.

Note that, as a method of providing the opening portions in the pixel separation film 280 and a method of establishing electric connection between the constituent members of the upper layer and the constituent members of the lower layer through the opening portions, for example, a method using a vapor deposition mask, a method using radiation of laser light disclosed in JP 2007-52966A and a method using a reverse tapered shape disclosed in JP 2013-54979A which are preceding applications filed by the same applicant as the present application, and the like can be applied.

Next, the B light emitting layer 230 is stacked over the entire faces of the anode 220, the cathode contact region 270, and the pixel separation film 280 as shown in FIG. 17B. The B light emitting layer 230 is stacked so as to be embedded in the opening portion provided in the pixel separation film 280 and to be at least in contact with the anode 220 through the opening portion. In order to ensure contact of the B light emitting layer 230 and the anode 220 more reliably, the B light emitting layer 230 is preferably stacked using a method with satisfactory coverage of the opening portion.

Next, as shown in FIG. 17C, the regions of the stacked B light emitting layer 230 corresponding to the opening portions of the pixel separation film 280 which are provided on the cathode contact region 270 and the charge generation layer electrode 295 are removed. Here, the removal of the B light emitting layer 230 may be performed such that at least the region corresponding to the light emission region remains and the surfaces of the cathode contact region 270 and the charge generation layer electrode 295 are exposed, and a specific region of the B light emitting layer 230 to be removed is not limited to the example shown in FIG. 17C.

Next, the charge generation layer 240 and the Y light emitting layer 250 are stacked over the entire face of the configuration shown in FIG. 17C in this order. Accordingly, the anode 220, the B light emitting layer 230, the charge generation layer 240, and the Y light emitting layer 250 are stacked in this order in the region corresponding to the light emission region. On the other hand, in the regions corresponding to the cathode contact region 270 and charge generation layer electrode 295, the charge generation layer 240 and the Y light emitting layer 250 are stacked in this order on the cathode contact region 270 and charge generation layer electrode 295. Accordingly, the charge generation layer electrode 295 and the charge generation layer 240 come in direct contact with each other, and thereby are electrically connected to each other.

Next, the region of the stacked charge generation layer 240 and the Y light emitting layer 250 corresponding to the opening portion of the pixel separation film 280 provided on the cathode contact region 270 is removed, and the cathode 260 is further stacked over the entire face. Accordingly, the cathode contact region 270 comes in direct contact with the cathode 260, and thus they are electrically connected. In this manner, the configuration of the organic EL element 20 shown in FIG. 15 is realized. Note that the removal of the stacked charge generation layer 240 and the Y light emitting layer 250 may be performed such that at least the region corresponding to the light emission region remains and the surface of the cathode contact region 270 is exposed, and specific regions of the charge generation layer 240 and the Y light emitting layer 250 to be removed are not limited to the example shown in FIG. 15.

Note that, when the organic EL element 20 has other layers which are not shown in FIG. 15, (for example, a hole injection layer, a hole transport layer, an electron injection layer, an electron transport layer, and the like), a step of forming the layers may be added at an appropriate stage. In addition, as a method of forming the layers, various known methods used in the manufacturing process of a general organic EL element may be applied.

4. Modified Examples

Next, several modified examples of the above-described first and second embodiments will be described. The first and second embodiments were described above exemplifying the stacking-type organic EL elements 10 and 20 in which the Y light emitting layers 150 and 250 are stacked in the upper layer of the B light emitting layers 130 and 230 and thereby the organic EL elements 10 and 20 emit white light as a whole. The first and second embodiments, however, are not limited thereto. The organic EL elements 10 and 20 according to the first and second embodiments may be stacking-type organic EL elements 10 and 20 having a plurality of organic light emitting layers stacked therein and thereby the organic EL elements 10 and 20 emit light having a predetermined wavelength band as a whole, and a type and the number of stacked light emitting layers, a wavelength band of light emitted from the plurality of light emitting layers as whole, and the like are not limited to the above-described examples.

Figure 18A:
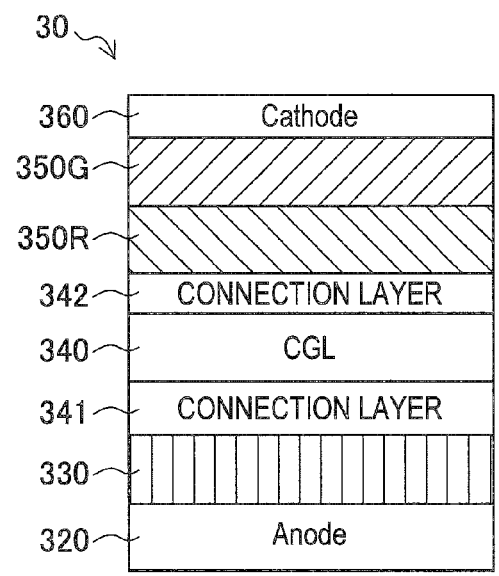
FIG. 18A is a schematic diagram showing a configuration example of an organic EL element having a different stacking structure from the first and second embodiments.
Figure 18B:
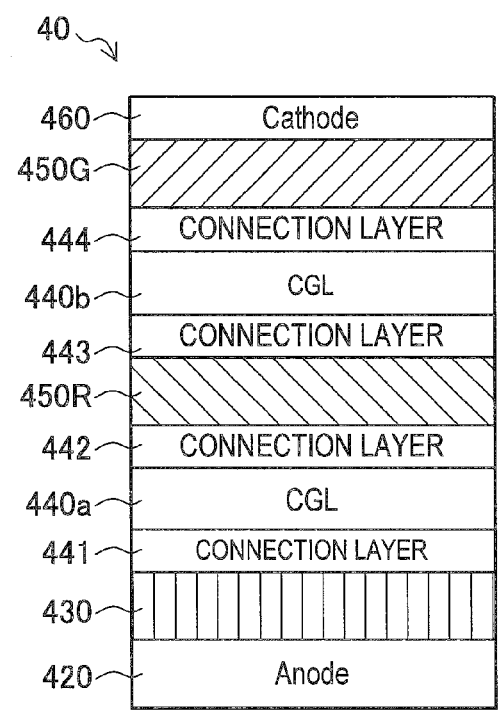
FIG. 18B is a schematic diagram showing a configuration example of an organic EL element having a different stacking structure from the first and second embodiments.

The modified examples of the first and second embodiments in which organic EL elements have different stacking structures will be described with reference to FIGS. 18A and 18B. FIGS. 18A and 18B are schematic diagrams showing configuration examples of the organic EL elements having different stacking structures from the first and second embodiments. For the sake of simplification, FIGS. 18A and 18B only illustrate the portions corresponding to anodes, cathode, and light emitting units interposed between the anodes and the cathodes of the stacking structures of the organic EL elements according to the present modified examples.

Referring to FIG. 18A, the organic EL element 30 according to the present modified example is a stacking-type organic EL element in which a blue light emitting layer 330 (B light emitting layer 330) which is an organic light emitting layer containing an organic compound and emitting blue light when a predetermined potential difference is supplied, a red light emitting layer 350R (R light emitting layer 350R) which is an organic light emitting layer containing an organic compound and emitting red light when a predetermined potential difference is supplied, and a green light emitting layer 350G (G light emitting layer 350G) which is an organic light emitting layer containing an organic compound and emitting green light when a predetermined potential difference is supplied are stacked as light emitting layers from a substrate side in this order. The B light emitting layer 330, the R light emitting layer 350R, and the G light emitting layer 350G are interposed between the anode 320 and the cathode 360, and when a predetermined potential difference is supplied between the anode 320 and the cathode 360, a predetermined potential difference is supplied to the B light emitting layer 330, the R light emitting layer 350R, and the G light emitting layer 350G, and thereby the B light emitting layer 330, the R light emitting layer 350R, and the G light emitting layer 350G each emit light having a predetermined wavelength band with predetermined luminance. The organic EL element 30 is configured to emit white light as a whole when the B light emitting layer 330, the R light emitting layer 350R, and the G light emitting layer 350G of the organic EL element 30 emit light at the same time under a predetermined condition.

Specifically, the organic EL element 30 is configured such that the anode 320, the B light emitting layer 330, a connection layer 341, a charge generation layer 340, another connection layer 342, the R light emitting layer 350R, the G light emitting layer 350G, and the cathode 360 are stacked in this order. Among these, the anode 320, the B light emitting layer 330, the charge generation layer 340, and the cathode 360 have the same functions as the anodes 120 and 220, the B light emitting layers 130 and 230, the charge generation layers 140 and 240, and the cathodes 160 and 260 according to the first and second embodiments described above, and thus detailed description thereof will be omitted. The B light emitting layer 330, the connection layer 341, the charge generation layer 340, the connection layer 342, the R light emitting layer 350R, and the G light emitting layer 350G which are regions in which light emission is performed when a potential difference is supplied correspond to the light emitting units 190 and 290 of the first and second embodiments.

The connection layers 341 and 342 are provided between the B light emitting layer 330 and the charge generation layer 340 and between the R light emitting layer 350R and the charge generation layer 340 respectively, and have a function of promoting exchange of electric charge between the portions. Since the connection layers 341 and 342 may be various known layers used as connection layers between organic light emitting layers in a general organic EL element, for example, a hole injection layer, a hole transport layer, an electron injection layer, an electron transport layer, and the like, detailed description thereof will be omitted.

When a voltage is applied by the anode 320 and the cathode 360, holes and electrons are injected into the R light emitting layer 350R and the G light emitting layer 350G from the cathode 360 and the charge generation layer 340 that is an intermediate layer, respectively. As recombination of the holes and electrons occurs inside the R light emitting layer 350R and the G light emitting layer 350G, light having wavelength bands corresponding to each of red and green is generated. The R light emitting layer 350R and the G light emitting layer 350G are composed of a material having high light emission efficiency, for example, an organic light emitting material such as a low-molecular fluorochrome, a fluorescent polymer, or a metal complex.

The R light emitting layer 350R is mainly composed of a host material having a hole transporting property and a guest material having a red light emission property. Among these, the guest material may be one having a fluorescent property, or one having a phosphorescent property, and is not particularly limited. The R light emitting layer 350R can be formed of a mixture in which, for example, α-naphthyl phenyl diamine (α-NPD) which is a hole transporting material is used as a host material, and 2,6-bis[(4'-methoxy diphenyleamino)styryl]-1,5-dicyanonaphthalene (BSN) serving as a red light emitting guest material is mixed with the host material.

The G light emitting layer 350G is composed of a host material and a green light emitting guest material. Among these, the guest material may be one having a fluorescent property, or one having a phosphorescent property, and is not particularly limited. The G light emitting layer 350G can be formed of a mixture in which, for example, anthracene dinaphthyl (ADN) is used as a host material, and coumarin 6 serving as a guest material is mixed with the host material.

The R light emitting layer 350R and the G light emitting layer 350G, however, are not limited thereto, and materials of the R light emitting layer 350R and the G light emitting layer 350G may be appropriately selected from various known organic-based materials having a red light emission property and a green light emission property which can be used as organic light emitting layers of organic EL elements.

The configuration interposed between the anode 120 and the cathode 160 in the organic EL element 10 shown in FIG. 8 of the first embodiment may replace the configuration of the organic EL element 30 according to the present modified example shown in FIG. 18A. In that configuration, the organic EL element 30 has the configuration in which the charge generation layer 340 is electrically connected to the cathode 360 via a resistance having a predetermined resistance value as in the first embodiment. Thus, when the organic EL element 30 is driven, a potential difference supplied to the R light emitting layer 350R and the G light emitting layer 350G stacked in the upper stage is suppressed, and thus light emission by the R light emitting layer 350R and the G light emitting layer 350G is suppressed, and as a result, a change in the color of white light emission that can be performed by the organic EL element 30 as a whole can be suppressed over a wider range of light emission luminance levels. Note that the value of the resistance provided between the charge generation layer 340 and the cathode 360 may be appropriately designed according to light emission characteristics of the B light emitting layer 330, the R light emitting layer 350R, and the G light emitting layer 350G (for example, dependency of chromaticity of light emission on a current density or the like) so that the change in the light emission color of the whole organic EL element 30 can be suppressed over a wider range of light emission luminance levels.

In addition, the configuration interposed between the anode 220 and the cathode 260 in the organic EL element 20 shown in FIG. 15 of the second embodiment may replace the configuration of the organic EL element 30 according to the present modified example shown in FIG. 18A. In that configuration, the charge generation layer 340 of the organic EL element 30 is electrically connected to the charge generation layer electrode which is connected to the power supply circuit as in the second embodiment and thereby potential thereof can be dynamically controlled. Thus, when the organic EL element 30 is driven, potential differences supplied to the B light emitting layer 330 stacked in the lower stage and the R light emitting layer 350R and the G light emitting layer 350G which are stacked in the upper stage can each be controlled, and accordingly, driving of the organic EL element 30 that enables a change in light emission characteristics of the B light emitting layer 330, the R light emitting layer 350R, and the G light emitting layer 350G according to a use environment to be compensated for according to a use environment is possible. Therefore, chromaticity of light emission of the B light emitting layer 330, the R light emitting layer 350R, and the G light emitting layer 350G can be controlled with higher accuracy in consideration of the range of light emission luminance in which the organic EL element 30 is used, a use time of the organic EL element 30, unevenness in manufacturing of the organic EL element 30, and the like, and thus changes in a light emission color of the organic EL element 30 attributable to various factors can be suppressed.

FIG. 18B shows another configuration example of the organic EL element according to the present modified example different from that shown in FIG. 18A. Referring to FIG. 18B, the organic EL element 40 according to the present modified example is a stacking-type organic EL element in which a blue light emitting layer 430 (B light emitting layer 430) that is an organic light emitting layer containing an organic compound and emitting blue light when a predetermined potential difference is supplied, a red light emitting layer 450R (R light emitting layer 450R) that is an organic light emitting layer containing an organic compound and emitting red light when a predetermined potential difference is supplied, and a green light emitting layer 450G (G light emitting layer 450G) that is an organic layer containing an organic compound and emitting green light when a predetermined potential difference is supplied are stacked on a substrate side in this order as light emitting layers. The B light emitting layer 430, the R light emitting layer 450R, and the G light emitting layer 450G are interposed between an anode 420 and a cathode 460, and when a predetermined potential difference is supplied between the anode 420 and the cathode 460, a predetermined potential difference is supplied to the B light emitting layer 430, the R light emitting layer 450R, and the G light emitting layer 450G, and accordingly, the B light emitting layer 430, the R light emitting layer 450R, and the G light emitting layer 450G each emit light having predetermined wavelength bands with predetermined luminance. The organic EL element 40 is configured such that, when the B light emitting layer 430, the R light emitting layer 450R, and the G light emitting layer 450G emit light at the same time under a predetermined condition, the organic EL element 40 emits white light as a whole.

As described above, the organic EL element 40 according to the present modified example has at least three or more organic light emitting layers that emit light having different wavelength bands and a plurality of charge generation layers arranged between the organic light emitting layers. Specifically, the organic EL element 40 is configured such that the anode 420, the B light emitting layer 430, a connection layer 441, a charge generation layer 440a, a connection layer 442, the R light emitting layer 450R, a connection layer 443, a charge generation layer 440b, a connection layer 444, the G light emitting layer 450G, and the cathode 460 are stacked in this order. As described above, the organic EL element 40 has the plurality of charge generation layers 440a and 440b. Here, out of the configuration, since the anode 420, the B light emitting layer 430, and the cathode 460 may have the same functions as the anodes 120 and 220, the B light emitting layers 130 and 230, and the cathodes 160 and 260 according to the above-described first and second embodiments, detailed description thereof will be omitted. In addition, since the charge generation layers 440a and 440b may have the same function as the charge generation layers 140 and 240 according to the first and second embodiments except for the fact that the number of layers provided is plural, detailed description thereof will be omitted. Further, since the R light emitting layer 450R, the G light emitting layer 450G, and the connection layers 441, 442, 443, and 444 may have the same functions as the R light emitting layer 350R, the G light emitting layer 350G, and the connection layers 341 and 342 of the organic EL element 30 shown in FIG. 18A described above except for the fact that the number of connection layers is different, detailed description thereof will be omitted. The B light emitting layer 430, the connection layer 441, the charge generation layer 440a, the connection layer 442, the R light emitting layer 450R, the connection layer 443, the charge generation layer 440b, the connection layer 444, and the G light emitting layer 450G which are regions in which light emission is performed when a potential difference is supplied correspond to the light emitting units 190 and 290 of the first and second embodiments.

The configuration interposed between the anode 120 and the cathode 160 in the organic EL element 10 shown in FIG. 8 of the first embodiment may replace the configuration of the organic EL element 40 according to the present modified example shown in FIG. 18B. In that configuration, the organic EL element 40 has the configuration in which the charge generation layers 440a and 440b are electrically connected to the cathode 460 via resistances having predetermined resistance values as in the first embodiment. Here, in the organic EL element 40, the resistance value of the first resistance provided between the charge generation layer 440*a* and the cathode 460 and the resistance value of the second resistance provided between the charge generation layer 440*b* and the cathode 460 may be adjusted so as to have different values. The first resistance can control a potential difference applied to the R light emitting layer 450R, and the second resistance can control a potential difference applied to the G light emitting layer 450G. Thus, by controlling the values of the first and second resistances independently of each other in the organic EL element 40, the potential differences supplied to the R light emitting layer 450R and the G light emitting layer 450G can be controlled with higher accuracy than in the organic EL element 30 described above. Therefore, a change in the color of white light that can be emitted from the organic EL element 40 as a whole can be suppressed over a wider range of light emission luminance levels with higher accuracy. Note that the values of the resistances provided between the charge generation layers 440*a* and 440*b* and the cathode 460 may be appropriately designed according to light emission characteristics of the B light emitting layer 430, the R light emitting layer 450R, and the G light emitting layer 450G (for example, dependency of chromaticity of light emission on a current density or the like) so that the change in the light emission color of the whole organic EL element 40 can be suppressed over a wider range of light emission luminance levels.

In addition, the configuration interposed between the anode 220 and the cathode 260 in the organic EL element 20 shown in FIG. 15 of the second embodiment may replace the configuration of the organic EL element 40 according to the present modified example shown in FIG. 18B. In that configuration, the charge generation layers 440*a* and 440*b* of the organic EL element 40 are electrically connected to charge generation layer electrodes which are connected to the power supply circuit as in the second embodiment and thereby potential thereof can be dynamically controlled. Here, in the organic EL element 40, the charge generation layers 440*a* and 440*b* may be electrically connected to different charge generation layer electrodes which are electrically insulated against each other, and thereby potential of the charge generation layers 440*a* and 440*b* may be controlled independently. Accordingly, a potential difference supplied to the B light emitting layer 430, a potential difference supplied to the R light emitting layer 450R, and a potential difference supplied to the G light emitting layer 450G can each be controlled, and driving of the organic EL element 40 that enables a change in light emission characteristics of the B light emitting layer 430, the R light emitting layer 450R, and the G light emitting layer 450G to be compensated for according to a use environment is possible. Therefore, chromaticity of light emission of the B light emitting layer 430, the R light emitting layer 450R, and the G light emitting layer 450G can be controlled with higher accuracy in consideration of the range of light emission luminance in which the organic EL element 40 is used, a use time of the organic EL element 40, unevenness in manufacturing of the organic EL element 40, and the like, and thus changes in a light emission color of the organic EL element 40 attributable to various factors can be further suppressed.

So far, the modified examples of the first and second embodiments in which the organic EL elements have different stacking structures have been described with reference to FIGS. 18A and 18B. Note that FIGS. 18A and 18B show examples of other stacking structures that the organic EL elements according to the first and second embodiments can assume, and the organic EL elements according to the first and second embodiments can also have a stacking structure other than those shown in FIGS. 18A and 18B. In the first and second embodiments, the organic EL elements may be an organic EL element configured such that a plurality of organic light emitting layers are stacked having charge generation layers which are intermediate layers therebetween, and a specific configuration thereof is arbitrary. By applying the charge generation layer contact structure of the first embodiment or the structure of the second embodiment in which potential of the charge generation layer is controlled through the charge generation layer electrode 295 to the charge generation layers of the organic EL element configured as described above, the same effects as described in <2. First embodiment> and <3. Second embodiment> above can be obtained.

For example, the organic EL elements according to the first and second embodiments may have a configuration in which two organic light emitting layers that emit light having different wavelength bands are stacked having one charge generation layer therebetween. With regard to this configuration, for example, a configuration in which an organic light emitting layer that emits blue light, a charge generation layer, and an organic light emitting layer that emits yellow light are stacked in this order (for example, the configuration shown in FIG. 1), a configuration in which an organic light emitting layer that emits yellow light, a charge generation layer, and an organic light emitting layer that emits blue light are stacked in this order (for example, the configuration shown in FIG. 8), and the like are considered.

In addition, the organic EL elements according to the first and second embodiments may have a configuration in which three organic light emitting layers that emit light of different wavelength bands are stacked having one charge generation layer therebetween. With regard to this configuration, for example, a configuration in which an organic light emitting layer that emits blue light, a charge generation layer, an organic light emitting layer that emits red light, and an organic light emitting layer that emits green light are stacked in this order (for example, the configuration shown in FIG. 18A), a configuration in which an organic light emitting layer that emits red light, an organic light emitting layer that emits green light, a charge generation layer, and a blue light emitting layer are stacked in this order, and the like are considered.

In addition, for example, the organic EL elements according to the first and second embodiments may have a configuration in which three organic light emitting layers that emit light of different wavelengths are stacked having two charge generation layers therebetween. With regard to this configuration, for example, a configuration in which an organic light emitting layer that emits blue light, a charge generation layer, an organic light emitting layer that emits red light, a charge generation layer, and an organic light emitting layer that emits green light are stacked in this order (for example, the configuration shown in FIG. 18B), and the like are considered. In addition, a configuration in which the order in which the organic light emitting layers are stacked in the above configuration is appropriately rearranged can also be applied to the organic EL elements according to the first and second embodiments More generally, the organic EL elements according to the first and second embodiments can have a configuration in which N organic light emitting layers that emit light of three different wavelengths (for example, red (R), green (G), and blue (B)) and M charge generation layers interposed between the N organic light emitting layers are stacked (N and M are arbitrary natural numbers). The type and the number of organic light emitting layers to be stacked, the number of charge generation layers to be stacked, and the like may be appropriately designed in view of the application and optical design of a device to which the organic EL elements according to the first and second embodiments are applied.

5. Application Examples

Next, application examples of the organic EL elements 10 and 20 according to the first and second embodiments and the organic EL elements 30 and 40 according to the modified examples of the first and second embodiments to various kinds of equipment, devices, and electronic apparatuses will be described. Note that, although cases in which the organic EL element 10 according to the first embodiment is mounted in various kinds of equipment, devices, and electronic apparatuses will be exemplified in the description with regard to the application examples below, the organic EL element 20 according to the second embodiment and the organic EL elements 30 and 40 according to the modified examples of the first and second embodiments can also be applied to various kinds of equipment, devices, and electronic apparatuses likewise.

[5-1. Application to an Organic EL Display Device]

Figure 19:
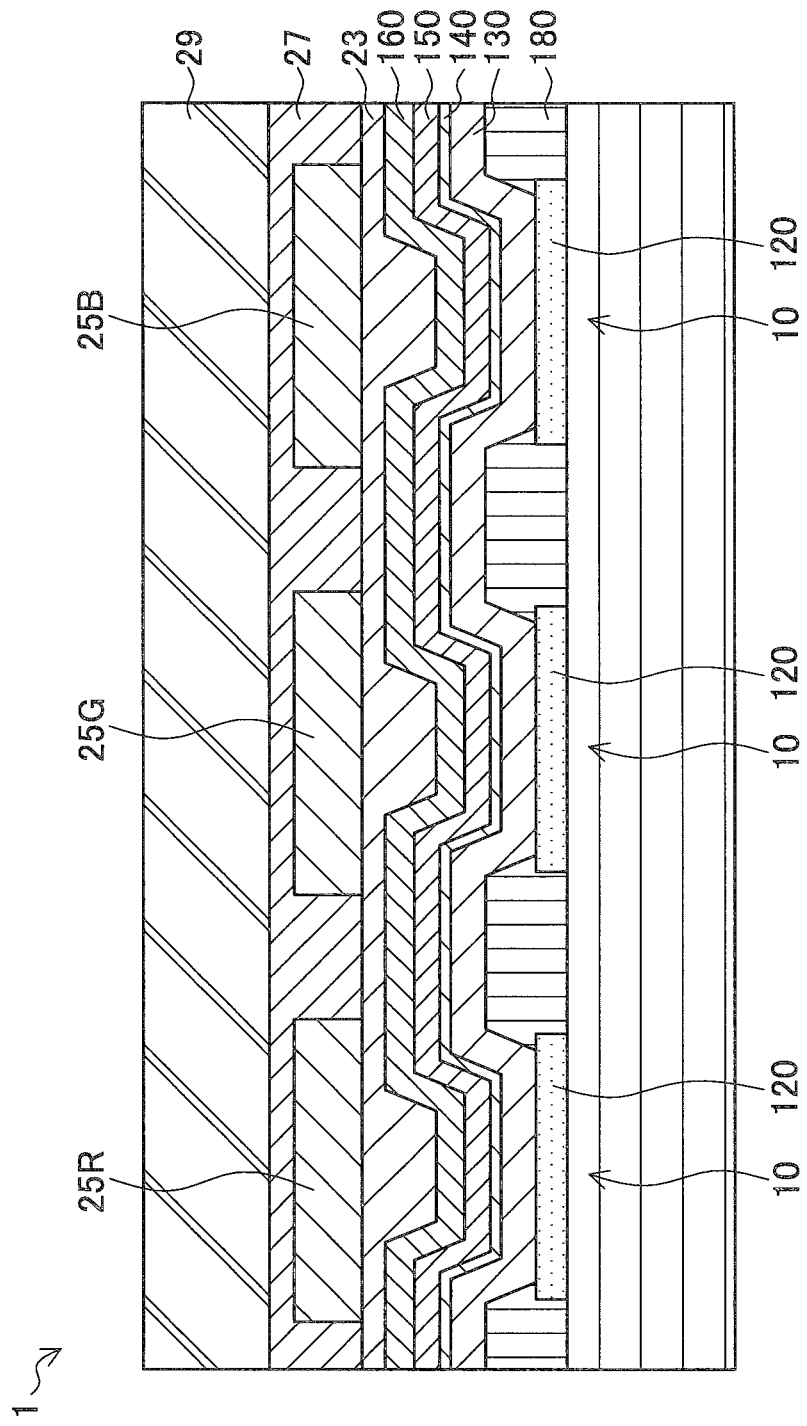
FIG. 19 is a cross-sectional diagram showing a schematic configuration of a region corresponding to one pixel of an organic EL display device to which the organic EL element according to the first embodiment is applied.
Figure 20:
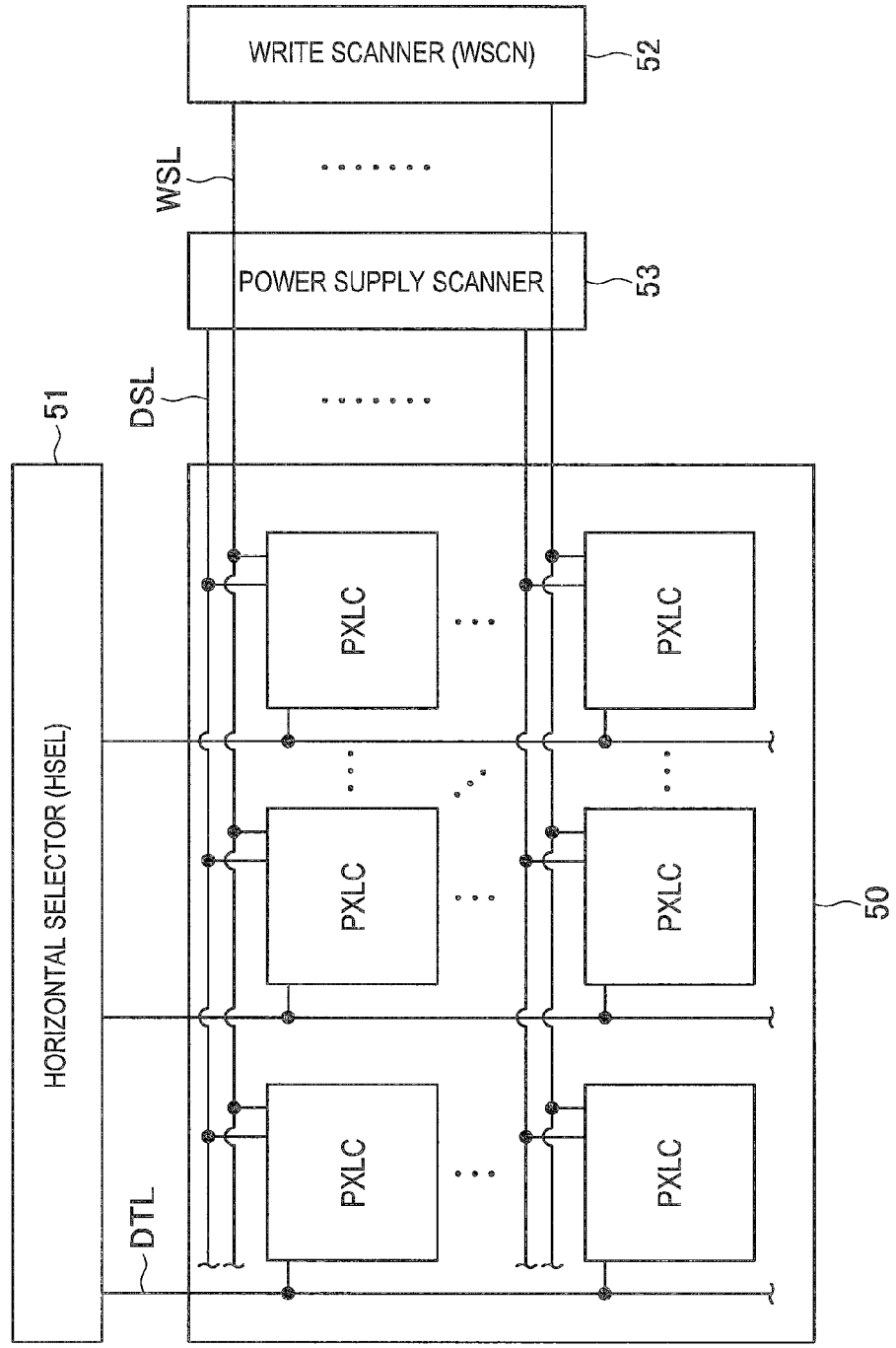
FIG. 20 is a schematic diagram showing a circuit configuration of the organic EL display device to which the organic EL element according to the first embodiment is applied.
Figure 21:
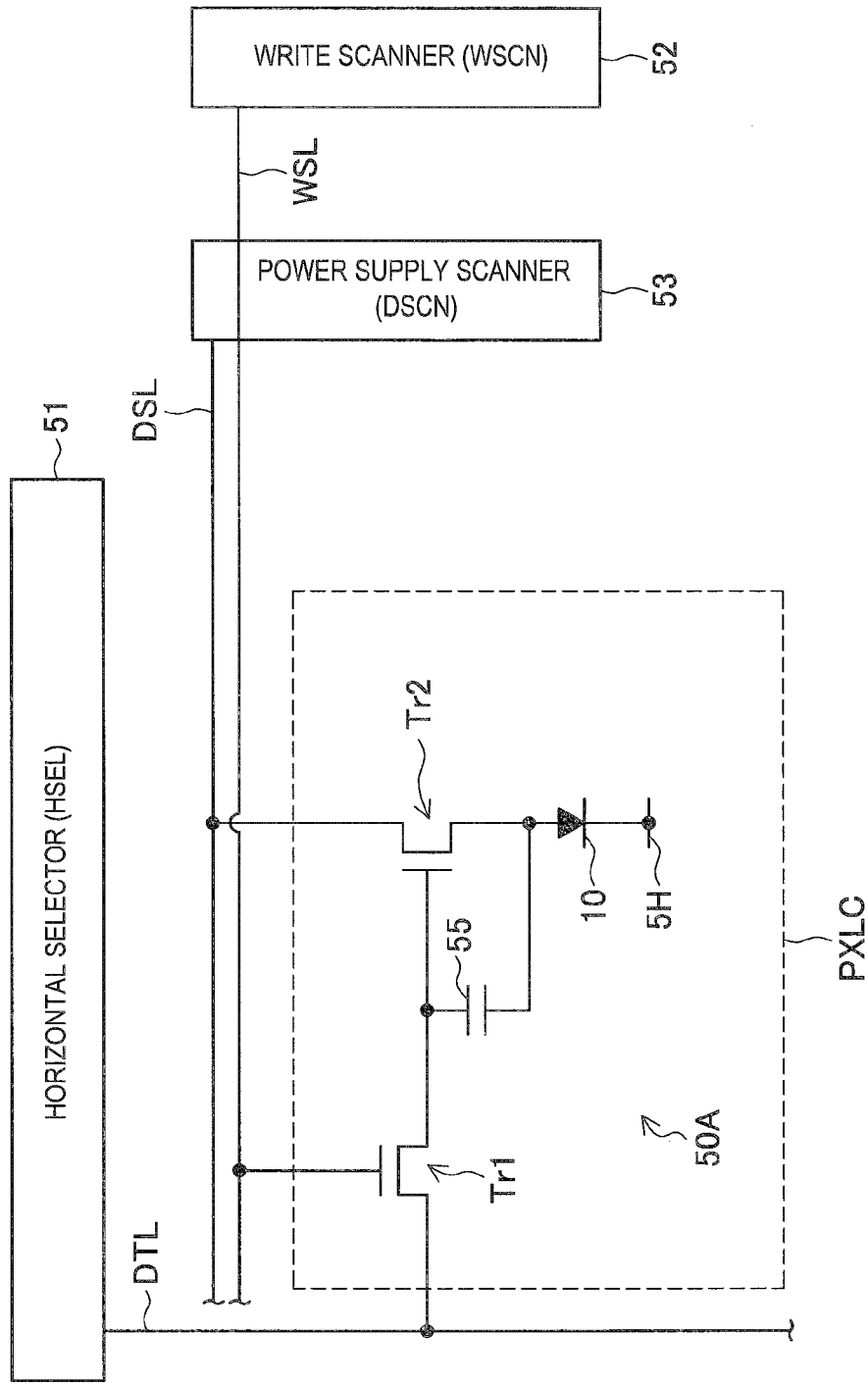
FIG. 21 is a schematic diagram showing a configuration of periphery circuits of one pixel out of the circuit configuration shown in FIG. 20 in detail.

The organic EL element 10 according to the first embodiment can be applied to an organic EL display device that uses the organic EL element 10 as a light emitting element of a pixel. Here, the organic EL display device can perform predetermined display on its display screen through respective light emitting elements of pixels of the display screen configured for the organic EL element 10, and the organic EL elements 10 are selectively driven by TFTs that are driving elements. With reference to FIGS. 19 to 21, a configuration example in which the organic EL element 10 according to the first embodiment is applied to a light emitting element of a pixel in an organic EL display device will be described. FIG. 19 is a cross-sectional diagram showing a schematic configuration of a region corresponding to one pixel of the organic EL display device to which the organic EL element 10 according to the first embodiment is applied. FIG. 20 is a schematic diagram showing a circuit configuration of the organic EL display device to which the organic EL element 10 according to the first embodiment is applied. FIG. 21 is a schematic diagram showing a configuration of periphery circuits of one pixel out of the circuit configuration shown in FIG. 20 in detail.

Referring to FIG. 19, the organic EL display device 1 is configured by arraying a plurality of organic EL elements 10 according to the above-described first embodiment on the substrate 110. The plurality of organic EL elements 10 are compartmentalized by the pixel separation film 180 in units of pixels so that, for example, one organic EL element 10 is positioned in one pixel.

Each organic EL element 10 is configured such that the anode 120 formed in a pattern, the B light emitting layer 130, the charge generation layer 140, the Y light emitting layer 150, and the cathode 160 are stacked on the substrate 110 in this order. The B light emitting layer 130, the charge generation layer 140, and the Y light emitting layer 150 may be, for example, a common solid film in each organic EL element 10. Since the detailed configuration of the organic EL element 10 has been described in [2-1. Structure of an organic EL element] above, detailed description thereof will be omitted herein. Note that, although not illustrated in FIG. 19 for the sake of simplification, an auxiliary electrode that functions as the cathode contact region 170 shown in FIG. 8 is provided in the same wiring layer as the anode 120 in the organic EL display device 1. Then, via holes obtained by removing parts of the solid film of the B light emitting layer 130, the charge generation layer 140, and the Y light emitting layer 150 are formed, and the cathode 160 and the auxiliary electrode are in an electrically connected state through the via holes.

A protective film 23 is provided over the entire surface over the substrate 110 on which the organic EL elements 10 are formed in an array. The protective film 23 is provided in order to protect the layers of the B light emitting layer 130, the charge generation layer 140, and the Y light emitting layer 150 formed of organic materials from moisture, and can be formed of a material having a relatively low water transmitting property and water absorbing property to have a thickness sufficient for preventing permeation of moisture into the B light emitting layer 130, the charge generation layer 140, and the Y light emitting layer 150. In addition, when the organic EL display device 1 is a top emission type, the protective film 23 is composed of a material that transmits light generated by the B light emitting layer 130 and the Y light emitting layer 150. With regard to a light transmittance of the protective film 23, for example, securing a transmittance of about 80% is desirable.

The protective film 23 may be formed of, for example, an insulating material. When the protective film 23 is formed of an insulating material, an inorganic amorphous insulating material, for example, amorphous silicon ($\alpha$-Si), amorphous silicon carbide ($\alpha$-SiC), amorphous silicon nitride ($\alpha$-Si$_{1-x}$N$_x$), amorphous carbon ($\alpha$-C), or the like can be preferably used. Such an inorganic amorphous insulating material has low water permeability since it does not include grain, and thus forms a favorable protective film 23.

When the protective film 23 composed of amorphous silicon nitride is formed, for example, it can be formed to have a thickness of 2 to 3 μm using a CVD method. At that time, however, it is desirable to form the film under conditions of a film formation temperature set to a normal temperature in order to prevent reduction in luminance caused by deterioration of the organic materials positioned in the lower layer and further minimizing stress of the film in order to prevent separation of the protective film 23.

In addition, when the organic EL display device 1 is an active matrix type and the cathode 160 is provided as a common electrode that covers one surface of the substrate 110, the protective film 23 may be configured using a conductive material. When the protective film 23 is composed of a conductive material, a transparent conductive material, for example, ITO or IZO, can be used.

A red filter 25R, a green filter 25G, and a blue filter 25B which are color filters are provided on the protective film 23. The red filter 25R, the green filter 25G, and the blue filter 25B are provided such that any one of the red filter 25R, the green filter 25G, and the blue filter 25B corresponds to each organic EL element 10. Accordingly, a pixel in which the red filter 25R is provided on one organic EL element 10 functions as a pixel that emits red light. In addition, a pixel in which the green filter 25G is provided on another organic EL element 10 functions as a pixel that emits green light. In addition, a pixel in which the blue filter 25B is provided on another organic EL element 10 functions as a pixel that emits blue light.

On the red filter 25R, the green filter 25G, and the blue filter 25B, a protective substrate 29 is affixed using an adhesive 27. As the adhesive 27, for example, an ultraviolet curable resin is used. In addition, as the protective substrate 29, for example, a glass substrate is used. When, however, the organic EL display device 1 is a top emission type, the adhesive 27 and the protective substrate 29 are formed of materials having a high light transmitting property.

The schematic configuration of the pixel region of the organic EL display device 1 in which the organic EL elements 10 according to the first embodiment are mounted has been described above with reference to FIG. 19. Next, a circuit configuration relating to driving of each of the pixels of the organic EL display device 1 will be described with reference to FIGS. 20 and 21.

As shown in FIGS. 20 and 21, the organic EL display device 1 has a plurality of pixels PXLC each including the above-described organic EL element 10. The pixels PXLC are disposed in, for example, a matrix shape in a display region 50 on the substrate 110. In the periphery of the display region 50, a horizontal selector (HSEL) 51 that is a signal line driving circuit, a write scanner (WSCN) 52 that is a scanning line driving circuit, and a power supply scanner 53 that is a power supply line driving circuit are provided.

In the display region 50, a plurality of signal lines DTL1 to DTLn (n is an integer) stretch in the column direction, and a plurality of scanning lines WSL1 to WSLm (m is an integer) stretch in the row direction. Further, a plurality of power supply lines DSL also stretch in the row direction. At each intersection of the signal lines DTL and the scanning lines DSL, the pixels PXLC (any one pixel corresponding to R, G, and B) are provided. Each signal line DTL is electrically connected to the horizontal selector 51, and video signals are supplied from the horizontal selector 51 to each pixel PXLC through the signal lines DTL. On the other hand, each scanning line WSL is electrically connected to the write scanner 52, and scanning signals (selection pulses) are supplied from the write scanner 52 to each pixel PXLC through the scanning lines WSL. In addition, each power supply line DSL is connected to the power supply scanner 53, and power supply signals (control pulses) are supplied from the power supply scanner 53 to each pixel PXLC through the power supply lines DSL.

FIG. 21 illustrates the detailed circuit configuration example of one pixel PXLC. Each pixel PXLC has a pixel circuit 50A including the organic EL element 10. In the illustrated example, the pixel circuit 50A is an active driving circuit that has a sampling transistor Tr1, a driving transistor Tr2, a retention capacitor element 55, and the organic EL element 10. Note that the retention capacitor element 55 is a capacitor element for retaining electric charge corresponding to a voltage to be applied to the organic EL element 10 when the pixel is driven.

The gate of the sampling transistor Tr1 is connected to the scanning line WSL. In addition, one of the source and the drain of the sampling transistor Tr1 is connected to the signal line DTL, and the other thereof is connected to the gate of the driving transistor Tr2. The drain of the driving transistor Tr2 is connected to the power supply line DSL, and the source thereof is connected to the anode of the organic EL element 10. In addition, the cathode of the organic EL element 10 is connected to a ground wire 5H having ground potential. Note that the ground wire 5H may be wired commonly for all of the pixels PXLC. In addition, the retention capacitor element 55 is disposed between the source and the gate of the driving transistor Tr2.

The sampling transistor Tr1 performs sampling on signal potential of the video signal supplied from the signal line DTL when it is conductive according to a scanning signal (selection pulse) supplied from the scanning line WSL, and retains the signal potential in the retention capacitor element 55. The driving transistor Tr2 receives supply of a current from the power supply line DSL set to predetermined first potential (not illustrated), and supplies a driving current to the organic EL element 10 according to the signal potential retained in the retention capacitor element 55. The organic EL element 10 can emit light with luminance according to the signal potential of the video signal due to the driving current supplied from the driving transistor Tr2. As the organic EL element 10 of each pixel PXLC is driven as described above, the organic EL display device 1 performs video display based on the video signal.

The configuration example in which the organic EL element 10 according to the first embodiment is applied to a light emitting element of a pixel in the organic EL display device 1 has been described above with reference to FIGS. 19 to 21. Here, the organic EL element 10 according to the first embodiment can suppress a change in chromaticity of white light over a wide range of light emission luminance levels as described in <2. First embodiment> above. Thus, by using the organic EL element 10 as a light emitting element of a pixel, proper balance of emission of light (balance of chromaticity) that the red filter 25R, the green filter 25G, and the blue filter 25B of the organic EL display device 1 have transmitted and extracted is attained with a suppressed change in chromaticity over a wide range of light emission luminance levels. Therefore, image can be displayed with higher quality.

In addition, instead of the organic EL element 10 according to the first embodiment, the organic EL element 20 according to the second embodiment can also be applied to the organic EL display device 1 as a light emitting element of pixels. As described in <3. Second embodiment> above, the organic EL element 20 according to the second embodiment can suppress a change in chromaticity of white light over a wider range of light emission luminance levels by adjusting potential of each organic light emitting layer so as to compensate for the change amount of ratios of light emission luminance. Thus, by using the organic EL element 20 as a light emitting element of pixels, the quality of images displayed by the organic EL display device 1 can be further improved. Note that the organic EL elements 30 and 40 according to the modified examples of the first and second embodiments can also be applied to the organic EL display device 1 as light emitting elements of pixels. When the organic EL elements 30 and 40 are used as light emitting elements of pixels, images with satisfactory quality in which a change in chromaticity caused by a use environment is suppressed can also be obtained as when the organic EL elements 10 and 20 according to the first and second embodiments are used.

[5-2. Application to Electronic Apparatuses Having Display Devices]

Figure 22:
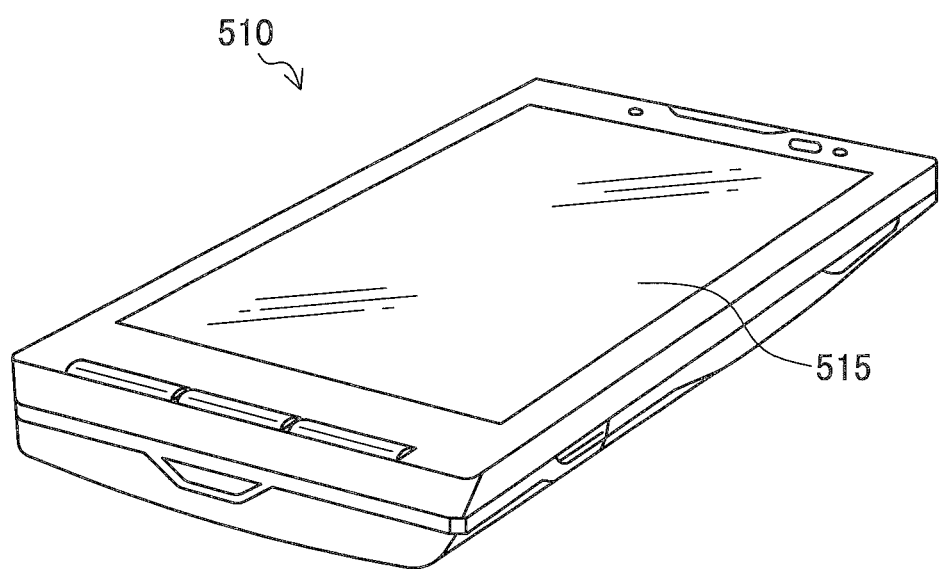
FIG. 22 is an external diagram of a smartphone to which the organic EL display device is applied.
Figure 23:
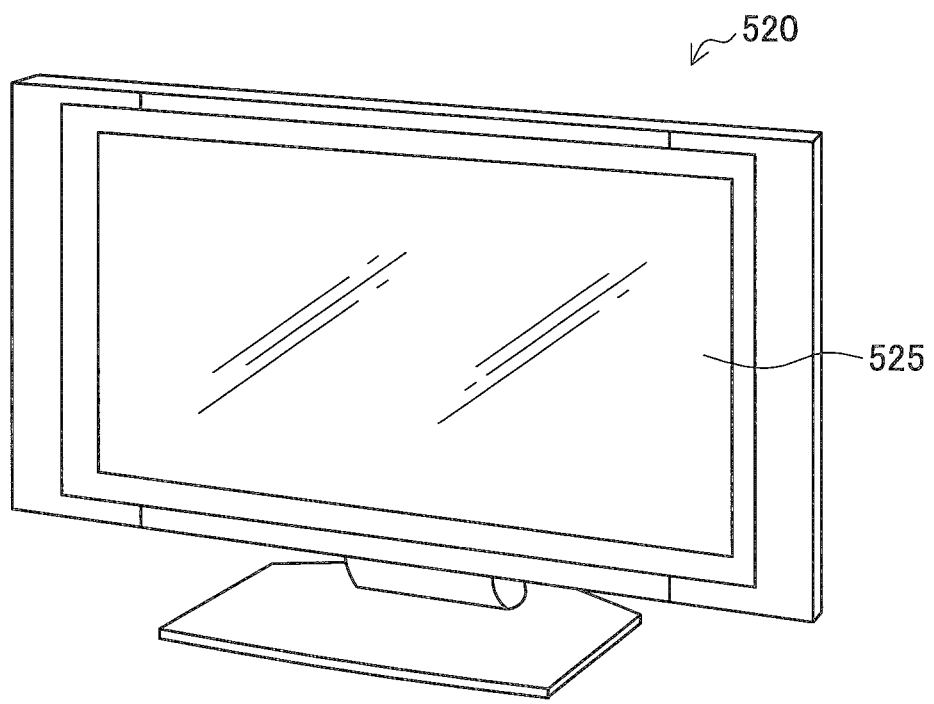
FIG. 23 is an external diagram of a display device to which the organic EL display device is applied.
Figure 24:
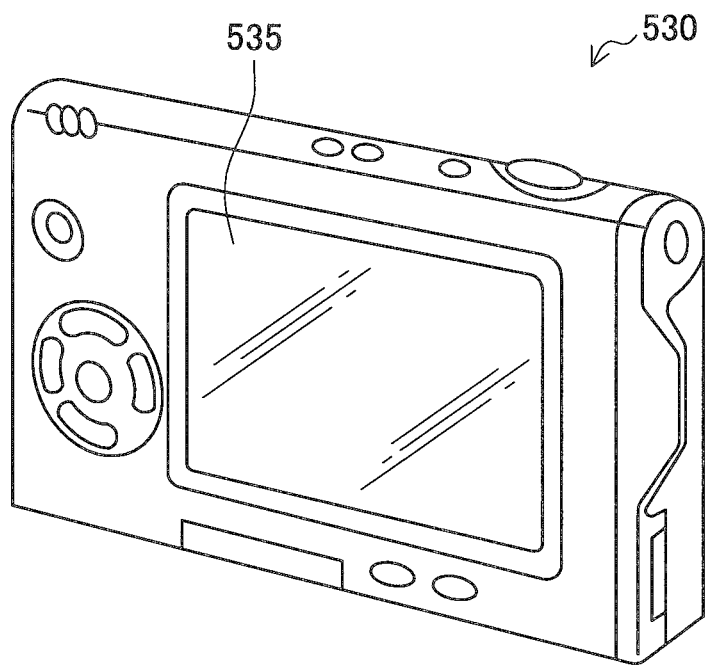
FIG. 24 is an external diagram of an imaging device to which the organic EL display device is applied.

The organic EL display device 1 in which the organic EL element 10, 20, 30, or 40 described above is mounted can also be preferably applied to various kinds of electronic apparatuses shown in, for example, FIGS. 22 to 24.

FIG. 22 is an external diagram of a smartphone to which the organic EL display device 1 is applied. Referring to FIG. 22, the smartphone 510 has a display screen 515 configured of, for example, a touch panel. On the display screen 515, various kinds of information processed by the smartphone 510 are displayed in various forms of text, images, graphs, and the like and a user can be notified thereof. The above-described organic EL display device 1 is mounted in the smartphone 510, and the display screen 515 corresponds to the display region 50 of the organic EL display device 1.

FIG. 23 is an external diagram of a display device 520 to which the organic EL display device 1 is applied. Referring to FIG. 23, the display device 520 has a display screen 525. On the display screen 525, various kinds of information processed by the display device 520 are displayed in various forms of text, images, graphs, and the like and a user can be notified thereof. The display device 520, for example, receives various kinds of content such as television programs, movies, and dynamic images distributed by broadcasting stations and content distribution servers, and then can display the content on the display screen 525. In addition, the display device 520 may be connected to an information processing device such as a personal computer (PC), and various kinds of information processed by the information processing device may be displayed on the display screen 525 of the display device 520. In the display device 520, the above-described organic EL display device 1 is mounted, and the display screen 525 corresponds to the display region 50 of the organic EL display device 1.

FIG. 24 is an external diagram of an imaging device 530 to which the organic EL display device 1 is applied. Referring to FIG. 24, the imaging device 530 has a display screen 535 in a partial region of the housing thereof. The imaging device 530 may be a so-called digital camera, for example, a digital still camera or a digital video camera which generates images of subjects as digital data by receiving light from the subjects using its image sensor and converting the light into electric signals. The imaging device 530 has the above-described organic EL display device 1 mounted therein, and the display screen 535 corresponds to the display region 50 of the organic EL display device 1. On the display screen 535, various kinds of information processed by the imaging device 530 are displayed in various forms of text, images, graphs, and the like and a user can be notified thereof. On the display screen 535, for example, image information of still images and dynamic images acquired by the imaging device 530, a setting screen for setting various photographing conditions (for example, a shutter speed, an exposure value, and the like) for imaging, and the like can be displayed.

Examples of electronic apparatuses to which the organic EL display device 1 mounted with the organic EL element 10, 20, 30, or 40 can be applied have been described above with reference to FIGS. 22 to 24. As described above, the organic EL display device 1 in which the organic EL element 10, 20, 30, or 40 is mounted can be applied as a display screen of various kinds of electronic apparatuses. By using the organic EL display device 1 as a display screen of electronic apparatuses, display of images with higher quality can be realized, and operability and satisfaction of a user who refers to the display screen can improve. Note that electronic apparatuses to which the organic EL display device 1 in which the organic EL element 10, 20, 30, or 40 is mounted according to the first and second embodiments and the modified examples thereof can be applied are not limited to the above-described examples, and the organic EL display device 1 may be applied to all electronic apparatuses as long as they have display screens.

In addition, although the cases in which the organic EL element 10, 20, 30, or 40 is applied to a display device or an image sensor have been described in the above application examples, apparatuses and devices to which the organic EL element 10, 20, 30, or 40 is applied are not limited thereto. For example, the organic EL element 10, 20, 30, or 40 may also be applied as a light source of an illuminating device. Since the organic EL element 10, 20, 30, or 40 can perform light emission with little change in chromaticity over a wider range of light emission luminance levels by using the organic EL element 10, 20, 30, or 40 as a light source of an illuminating device, a more stable illuminating device with little change in an illumination color with respect to a change in luminance is realized. The illuminating device may have any of various known configurations of general illuminating devices, for example, a driving circuit for driving the organic EL element 10, 20, 30, or 40 as a light source by supplying a predetermined potential difference to the organic EL element 10, 20, 30, or 40.

6. Conclusion and Supplement

Preferred embodiments of the present disclosure have been described in detail above. According to the embodiments of the present disclosure as described above, in the organic EL element in which a plurality of light emitting layers containing organic compounds are stacked having a charge generation layer that is an intermediate layer therebetween, the potential control mechanism that controls potential of the charge generation layer to be potential between that of the anode and that of the cathode is provided. With the potential control mechanism, potential of the plurality of light emitting layers can be controlled, and thus a change in chromaticity of light emission from the whole organic EL element with respect to a change in grayscales (a change in a current density or a change in luminance) can be suppressed. Accordingly, light emission with little change in chromaticity over a wider range of light emission luminance levels is realized. In addition, with the potential control mechanism, it is possible to intentionally change chromaticity depending on a situation.

As a specific configuration of the potential control mechanism, the potential control mechanism of the first embodiment has the intermediate layer contact structure in which the charge generation layer and the cathode are electrically connected to each other with the resistance having a predetermined resistance value therebetween. Since the intermediate layer contact structure can be realized with a relatively simple process and a simple configuration, the effect of suppressing a change in chromaticity as described above can be obtained while suppressing a rise in manufacturing costs incurred due to the provision of the intermediate layer contact structure.

In addition, as another specific configuration of the potential control mechanism, the potential control mechanism of the second embodiment has the structure in which the charge generation layer electrode that is electrically connected to the charge generation layer is provided and potential of the charge generation layer is controlled by applying predetermined potential to the charge generation layer electrode. In this structure, potential of the plurality of light emitting layers can be dynamically controlled more finely according to a change in the light emission characteristics of the light emitting layers caused in a use environment, which is, for example, deterioration of luminance attributable to use for a long period of time, and thus a change in chromaticity can be more appropriately controlled.

Since it is not necessary in either of the first and second embodiments to perform complicated signal processing as in, for example, the technology disclosed in JP 2012-194256A described above, a change in chromaticity can be suppressed with the simpler configurations while suppressing a rise in power consumption and manufacturing costs. In addition, according to the first and second embodiments, the organic EL elements that suppress a change in chromaticity over a wider range of light emission luminance levels are realized in that manner, and when the organic EL elements are applied to display devices, illuminating devices, and the like, image display with high quality in the display devices and more stable illumination in the illuminating devices are possible.

Hereinabove, although the preferred embodiments of the present disclosure have been described in detail with reference to the accompanying drawings, the technical scope of the present disclosure is not limited thereto. It should be understood by those skilled in the art that various modifications, combinations, sub-combinations and alterations may occur depending on design requirements and other factors insofar as they are within the scope of the appended claims or the equivalents thereof.

Further, the effects described in the present specification are definitely illustrative and demonstrative, and not limitative. That is, the technology according to the present disclosure can exhibit other effects which are clear to those skilled in the art based on the description of the present specification, along with or instead of the above-described effects.

For example, although the case in which the intermediate layer with the potential control function is the charge generation layer has been described in the above-described embodiments, the present technology is not limited thereto. The intermediate layer with the potential control function may be a layer interleaved between a plurality of stacked organic light emitting layers, and the type of the layer is not limited. Since a specific stacking structure of an organic EL element can be decided according to applications, optical design, and the like of the organic EL element, it is better to appropriately select an intermediate layer with the potential control function according to the stacking structure of the organic EL element so that a change in chromaticity of light emission of the whole organic EL element is properly suppressed and accordingly potential of light emitting layers can be controlled.

Additionally, the present technology may also be configured as below.

(1) An organic EL element including:
  a light emitting unit including at least
    a plurality of light emitting layers each containing an organic compound and emitting light when a predetermined potential difference is supplied and
    an intermediate layer that is arranged between the light emitting layers to inject electric charge into the light emitting layers;
  an anode and a cathode between which the light emitting unit is interposed in a stacking direction and which supply the predetermined potential difference to the light emitting unit; and
  a potential control mechanism configured to control potential of the intermediate layer in a manner that the potential is set to potential between potential of the anode and potential of the cathode.

(2) The organic EL element according to (1), wherein the potential control mechanism has an intermediate layer contact structure in which the intermediate layer and the cathode are electrically connected to each other with a resistance having a predetermined resistance value therebetween.

(3) The organic EL element according to (2), wherein the resistance value of the intermediate layer contact structure is adjusted based at least on a material of the intermediate layer, a thickness of the intermediate layer, and surface roughness of a contact face of the intermediate layer and the cathode.

(4) The organic EL element according to (2) or (3),
  wherein the light emitting unit is configured in a manner that at least a blue light emitting layer that emits light having a wavelength band corresponding to blue, the intermediate layer, and a yellow light emitting layer that emits light having a wavelength band corresponding to yellow are stacked in this order, and white light is emitted when the blue light emitting layer and the yellow light emitting layer emit light simultaneously and
  wherein the intermediate layer contact structure enables a potential difference supplied at least to the blue light emitting layer and the yellow light emitting layer to be adjusted.

(5) The organic EL element according to any one of (2) to (4), further including:
  a cathode contact region configured to be formed in a wiring layer different from the cathode and to be a wiring pattern connected to the same potential as the cathode,
  wherein the intermediate layer is electrically connected to the cathode contact region in the intermediate layer contact structure.

(6) The organic EL element according to (1),
  wherein the potential control mechanism includes an intermediate layer electrode that is electrically connected to the intermediate layer, and
  wherein potential of the intermediate layer is controlled by predetermined potential supplied to the intermediate layer electrode.

(7) The organic EL element according to (6), wherein the potential supplied to the intermediate layer electrode is controlled in a manner that a change amount of ratios of light emission luminance of the plurality of respective light emitting layers according to a use environment is compensated for.

(8) The organic EL element according to (7), wherein the use environment includes at least one of light emission luminance of the whole organic EL element, a use time of the organic EL element, and a use temperature of the organic EL element.

(9) The organic EL element according to any one of (6) to (8),
  wherein the light emitting unit is configured in a manner that at least a blue light emitting layer that emits light having a wavelength band corresponding to blue, the intermediate layer, and a yellow light emitting layer that emits light having a wavelength band corresponding to yellow are stacked in this order, and white light is emitted when the blue light emitting layer and the yellow light emitting layer emit light simultaneously, and
  wherein a potential difference supplied at least to the blue light emitting layer and the yellow light emitting layer is adjusted by predetermined potential supplied to the intermediate layer electrode.

(10) The organic EL element according to any one of (6) to (8),
  wherein the light emitting unit includes at least three or more light emitting layers that emit light having different wavelength bands and a plurality of the intermediate layers arranged between the light emitting layers, and
  wherein the organic EL element further includes a plurality of intermediate layer electrodes that are electrically connected to the respective plurality of the intermediate layers.

(11) A display device in which an organic EL element is used as a light emitting element of a pixel included in a display screen, the organic EL element including:
  a light emitting unit including
    at least a plurality of light emitting layers that emit light when a predetermined potential difference is supplied, and
    an intermediate layer that is arranged between the light emitting layers to inject electric charge into the light emitting layers;
  an anode and a cathode between which the light emitting unit is interposed in a stacking direction and which supply the predetermined potential difference to the light emitting unit; and
  a potential control mechanism configured to control potential of the intermediate layer of the light emitting unit in a manner that the potential is set to potential between potential of the anode and potential of the cathode.

(12) An illuminating device in which an organic EL element is used as a light source, the organic EL element including:
a light emitting unit including
at least a plurality of light emitting layers that emit light when a predetermined potential difference is supplied, and
an intermediate layer that is arranged between the light emitting layers to inject electric charge into the light emitting layers;
an anode and a cathode between which the light emitting unit is interposed in a stacking direction and which supply the predetermined potential difference to the light emitting unit; and
a potential control mechanism configured to control potential of the intermediate layer of the light emitting unit in a manner that the potential is set to potential between potential of the anode and potential of the cathode.

What is claimed is:

1. An organic EL element comprising:
a light emitting unit including at least
a plurality of light emitting layers each containing an organic compound and emitting light when a predetermined potential difference is supplied and
an intermediate layer that is arranged between the light emitting layers to inject electric charge into the light emitting layers;
an anode and a cathode between which the light emitting unit is interposed in a stacking direction and which supply the predetermined potential difference to the light emitting unit; and
a potential control mechanism configured to control potential of the intermediate layer in a manner that the potential is set to potential between potential of the anode and potential of the cathode.

2. The organic EL element according to claim 1, wherein the potential control mechanism has an intermediate layer contact structure in which the intermediate layer and the cathode are electrically connected to each other with a resistance having a predetermined resistance value therebetween.

3. The organic EL element according to claim 2, wherein the resistance value of the intermediate layer contact structure is adjusted based at least on a material of the intermediate layer, a thickness of the intermediate layer, and surface roughness of a contact face of the intermediate layer and the cathode.

4. The organic EL element according to claim 2,
wherein the light emitting unit is configured in a manner that at least a blue light emitting layer that emits light having a wavelength band corresponding to blue, the intermediate layer, and a yellow light emitting layer that emits light having a wavelength band corresponding to yellow are stacked in this order, and white light is emitted when the blue light emitting layer and the yellow light emitting layer emit light simultaneously and
wherein the intermediate layer contact structure enables a potential difference supplied at least to the blue light emitting layer and the yellow light emitting layer to be adjusted.

5. The organic EL element according to claim 2, further comprising:
a cathode contact region configured to be formed in a wiring layer different from the cathode and to be a wiring pattern connected to the same potential as the cathode,
wherein the intermediate layer is electrically connected to the cathode contact region in the intermediate layer contact structure.

6. The organic EL element according to claim 1,
wherein the potential control mechanism includes an intermediate layer electrode that is electrically connected to the intermediate layer, and
wherein potential of the intermediate layer is controlled by predetermined potential supplied to the intermediate layer electrode.

7. The organic EL element according to claim 6, wherein the potential supplied to the intermediate layer electrode is controlled in a manner that a change amount of ratios of light emission luminance of the plurality of respective light emitting layers according to a use environment is compensated for.

8. The organic EL element according to claim 7, wherein the use environment includes at least one of light emission luminance of the whole organic EL element, a use time of the organic EL element, and a use temperature of the organic EL element.

9. The organic EL element according to claim 6,
wherein the light emitting unit is configured in a manner that at least a blue light emitting layer that emits light having a wavelength band corresponding to blue, the intermediate layer, and a yellow light emitting layer that emits light having a wavelength band corresponding to yellow are stacked in this order, and white light is emitted when the blue light emitting layer and the yellow light emitting layer emit light simultaneously, and
wherein a potential difference supplied at least to the blue light emitting layer and the yellow light emitting layer is adjusted by predetermined potential supplied to the intermediate layer electrode.

10. The organic EL element according to claim 6,
wherein the light emitting unit includes at least three or more light emitting layers that emit light having different wavelength bands and a plurality of the intermediate layers arranged between the light emitting layers, and
wherein the organic EL element further includes a plurality of intermediate layer electrodes that are electrically connected to the respective plurality of the intermediate layers.

11. A display device in which an organic EL element is used as a light emitting element of a pixel included in a display screen, the organic EL element comprising:
a light emitting unit including
at least a plurality of light emitting layers that emit light when a predetermined potential difference is supplied, and
an intermediate layer that is arranged between the light emitting layers to inject electric charge into the light emitting layers;
an anode and a cathode between which the light emitting unit is interposed in a stacking direction and which supply the predetermined potential difference to the light emitting unit; and
a potential control mechanism configured to control potential of the intermediate layer of the light emitting unit in a manner that the potential is set to potential between potential of the anode and potential of the cathode.

12. An illuminating device in which an organic EL element is used as a light source, the organic EL element comprising:
a light emitting unit including
at least a plurality of light emitting layers that emit light when a predetermined potential difference is supplied, and an intermediate layer that is arranged between the light emitting layers to inject electric charge into the light emitting layers;

an anode and a cathode between which the light emitting unit is interposed in a stacking direction and which supply the predetermined potential difference to the light emitting unit; and a potential control mechanism configured to control potential of the intermediate layer of the light emitting unit in a manner that the potential is set to potential between potential of the anode and potential of the cathode.

* * * * *